United States Patent
Ishihara et al.

(10) Patent No.: US 8,111,573 B2
(45) Date of Patent: Feb. 7, 2012

(54) NONVOLATILE SEMICONDUCTOR MEMORY DEVICE AND METHOD OF CONTROLLING THE SAME

(75) Inventors: Kazuya Ishihara, Osaka (JP); Yutaka Ishikawa, Osaka (JP); Yoshiji Ohta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 268 days.

(21) Appl. No.: 12/611,279

(22) Filed: Nov. 3, 2009

(65) Prior Publication Data

US 2010/0118592 A1  May 13, 2010

(30) Foreign Application Priority Data

Nov. 4, 2008 (JP) ................................. 2008-283009

(51) Int. Cl.
  *G11C 7/00* (2006.01)
(52) U.S. Cl. ................ 365/218; 365/185.29; 365/185.22
(58) Field of Classification Search .................. 365/218, 365/185.29, 185.22
  See application file for complete search history.

(56) References Cited

U.S. PATENT DOCUMENTS

| | | | |
|---|---|---|---|
| 5,933,847 A | 8/1999 | Ogawa | |
| 6,219,280 B1 * | 4/2001 | Naganawa | ............... 365/185.22 |
| 6,815,744 B1 | 11/2004 | Beck et al. | |
| 7,433,222 B2 | 10/2008 | Hosoi et al. | |
| 2005/0243595 A1 | 11/2005 | Rinerson et al. | |
| 2006/0083096 A1 | 4/2006 | Yang | |

FOREIGN PATENT DOCUMENTS

| | | |
|---|---|---|
| JP | 4-276393 A | 10/1992 |
| JP | 8-18018 A | 1/1996 |
| JP | 09-97218 | 4/1997 |
| JP | 2001-067258 | 3/2001 |
| JP | 2002-133899 A | 5/2002 |
| JP | 2002-279789 A | 9/2002 |
| JP | 2002-537627 | 11/2002 |
| JP | 2007-188603 | 7/2007 |

OTHER PUBLICATIONS

H. Pagnia et al., "Bistable Switching in Eleetrotbrmed Metal—Insulator—Metal Devices", Phys. Stat. Sol. (a), vol. 108, pp. 11-65, 1988.

* cited by examiner

*Primary Examiner* — Son Dinh
*Assistant Examiner* — Nam Nguyen
(74) *Attorney, Agent, or Firm* — Nixon & Vanderhye, P.C.

(57) ABSTRACT

Provided is a nonvolatile semiconductor memory device capable of performing a writing action for a memory cell at high speed. The device includes a memory cell array having a first sub-bank and a second sub-bank each having a plurality of nonvolatile memory cells arranged in a form of a matrix; a row decoder shared by the first sub-bank and the second sub-bank; a first column decoder and a second column decoder provided in the first sub-bank and the second sub-bank, respectively; and a control circuit arranged to execute alternately a first action cycle to perform a programming action in the first sub-bank and a reading action for a programming verifying action in the second sub-bank and a second action cycle to perform the reading action for the programming verifying action in the first sub-bank and the programming action in the second sub-bank.

11 Claims, 16 Drawing Sheets

NONVOLATILE SEMICONDUCTOR MEMORY DEVICE AND METHOD OF CONTROLLING THE SAME

CROSS REFERENCE TO RELATED APPLICATION

This Nonprovisional application claims priority under 35 U.S.C. §119(a) on Patent Application No. 2008-283009 filed in Japan on 4 Nov. 2008 the entire contents of which are hereby incorporated by reference.

BACKGROUND OF THE INVENTION

1. Field of the Invention

The present invention relates to a nonvolatile semiconductor memory device and a method of controlling the same.

2. Description of the Related Art

Nonvolatile semiconductor memory devices (nonvolatile memories) are used as large-capacity and small-size information recording media, in a variety of fields such as computers, communication and measurement devices, automatic controllers, and appliances used around individuals. In addition, application software used in the above computers employs data-rewritable nonvolatile memories because it can desirably fix bugs and can be upgraded. The nonvolatile memories include a flash memory, and a RRAM (Resistive Random Access Memory).

The configuration and action of each of the flash memory and RRAM will be described.

First, the flash memory will be described. The flash memory includes an ETOX (registered trademark of U.S. Intel Corporation) flash memory.

Here, FIG. 8 shows a schematic constitution example of a memory cell array $A_T$ of the ETOX flash memory, and the memory cell array $A_T$ is composed of a plurality of memory cells (ETOX cells). The memory cell array $A_T$ shown in FIG. 8 is configured such that m×n ETOX cells $M_T$ are arranged in the form of a matrix, and gate terminals of the memory cells $M_T$ on the same row are connected to the same word line WLi (i=1 to m, m=2048, for example), and drain terminals of the memory cells $M_T$ on the same column are connected to the same bit line BLj (j=1 to n, n=512, for example), and source terminals of all the memory cells $M_T$ are connected to a common source line SL. The ETOX flash memory further has a row decoder which applies a voltage to the word line WLi (i=1 to m) based on a row address signal, a column decoder which applies a voltage to the bit line BLj (j=1 to n) based on a column address signal, and an erasing circuit which applies a high voltage Vpp (12V, for example) to the source line SL based on an erasing signal, which are provided as peripheral circuits of the memory cell array $A_T$.

FIG. 9 shows the configuration of the ETOX cell as the memory cell in the ETOX flash memory. As shown in FIG. 9, the ETOX cell is composed of a source 103 and a drain 102 formed in a semiconductor substrate 101 and having a polarity different from that of the semiconductor substrate 101, and a gate insulation film 104 formed on the semiconductor substrate 101, and a floating gate 105, an interlayer insulation film 106, and a control gate 107 formed on the gate insulation film 104 above a region sandwiched between the drain and the source.

A descriptions will be briefly made of each action of programming, reading, and erasing of the ETOX cell. In addition, here, it is assumed that when a threshold voltage of the memory cell is high, its state is a programmed state "0", and when the threshold voltage of the memory cell is low, its state is an erased state "1" in the flash memory.

First, the programming action of the ETOX cell $M_T$ will be described. The programming action for the ETOX cell $M_T$ is performed by applying a low source voltage Vs (0V, for example) to the source 103, a drain voltage Vd (6V, for example) higher than the source voltage Vs, to the drain 102, and a high gate voltage Vg (12V, for example) to the control gate 107, in the programming target cell $M_T$ which is a memory cell $M_T$ to be programmed. At this time, a hot electron is generated at the region sandwiched between the source and drain in the semiconductor substrate 101, and injected to the floating gate, whereby the threshold voltage of the ETOX cell is raised.

In addition, since programming characteristics vary in the memory cell such as the ETOX cell due to variation in production process, a programming verifying action is performed to verify whether or not the threshold voltage of the programming target cell $M_T$ is not less than a predetermined programming verifying threshold value Vthp (5.3V, for example). The programming verifying action is performed by applying a voltage to the programming target cell $M_T$ and a reference cell whose threshold voltage is the programming verifying threshold voltage under a predetermined programming verifying voltage condition, and when it is verified that the threshold voltage of the programming target cell $M_T$ is not less than the threshold voltage of the reference cell, it is verified that the programming action has been normally completed. When it is verified that the programming action has not been normally completed, a re-programming action and a programming verifying action after the re-programming action are performed. In addition, when it is verified that the programming action has been normally completed after the re-programming action, it is confirmed whether or not the programming target cell $M_T$ is in a programming excess state by comparing its threshold voltage with a programming excess verifying threshold voltage.

Next, the reading action for the ETOX cell $M_T$ will be described. The reading action of the ETOX cell $M_T$ is performed by applying a low source voltage Vs (0V, for example) to the source 103, a drain voltage Vd (1V, for example) a little higher than the source voltage Vs to the drain 102, and a gate voltage Vg (5V, for example) higher than the drain voltage Vd, to the control gate 107 in the reading target cell $M_T$ which is a memory cell $M_T$ to be read, and it is verified whether the reading target cell $M_T$ is in the programmed state or the erased state, based on the amount of the current flowing between the source and drain of the reading target cell $M_T$. More specifically, when the value of the current flowing between the source and drain of the reading target cell $M_T$ is smaller than a predetermined verifying current value, the programmed state "0" is determined and when it is larger than the verifying current value, the erased state "1" is determined.

Next, the erasing action for the ETOX cell $M_T$ will be described. The erasing action of the ETOX cell $M_T$ is performed by applying a high source voltage Vs (12V, for example) to the source 103, and a low gate voltage Vg (0V, for example) to the control gate 107 and keeping the drain 102 in a floating state, in the erasing target cell $M_T$ which is a memory cell $M_T$ to be erased. At this time, a fowler-nordheim current flows between the floating gate and source through the tunnel oxide film 104 of the erasing target cell $M_T$ and electrons are withdrawn from the floating gate 105 and the threshold voltage of the erasing target cell $M_T$ is lowered.

After the erasing action, an erasing verifying action is performed to verify whether or not the threshold voltage of the erasing target cell $M_T$ is not more than an erasing verifying threshold voltage V the (3.1V, for example). The erasing verifying action is performed by applying a voltage to the erasing target cell $M_T$ and a reference cell whose threshold voltage is the erasing verifying threshold voltage under a predetermined erasing verifying voltage, and when it is verified that the threshold voltage of the erasing target cell $M_T$ is not more than the threshold voltage of the reference cell, it is verified that the erasing action has been normally completed. When it is verified that the erasing action has not been normally completed, a re-erasing action and an erasing verifying action after the re-erasing action are performed.

Meanwhile, since the erasing speed of the erasing action is 0.6 to 1 second in general, it is lower than the programming speed of the programming action. Therefore, the erasing action is performed by the block composed of a plurality of, for example, 64 k bytes of memory cells in an actual device.

Next, the RRAM will be described. The RRAM is a resistive nonvolatile memory using a variable resistive element whose electric resistance is changed reversibly in response to the application of a voltage pulse.

Here, FIG. 10 shows a schematic configuration example of a memory cell array $A_R$ of the RRAM, and the memory cell array $A_R$ includes a plurality of memory cells $M_R$. The memory cell $M_R$, is composed of one transistor T and one variable resistive element R, and one end of the variable resistive element R is connected to a drain terminal of the transistor T. The memory cell array $A_R$ shown in FIG. 10 is configured such that m×n memory cells $M_R$ are arranged in the form of a matrix, gate terminals of the transistors T on the same row are connected to the same word line WLi (i=1 to m), the other ends of the variable resistive elements R on the same column are connected to the same bit line BLj (j=1 to n), and source terminals of all the memory cells $M_R$ are connected to a common source line SL. The RRAM further has a row decoder which applies a voltage to the word line WLi (i=1 to m) based on a row address signal, a column decoder which applies a voltage to the bit line BLj (j=1 to n) based on a column address signal, and an erasing circuit which applies a voltage to the source line SL based on an erasing signal, which are provided as peripheral circuits of the memory cell array $A_R$.

FIG. 11 shows a schematic configuration example of the variable resistive element R. As shown in FIG. 11, the structure of the variable resistive element R is extremely simple such that a lower electrode 211, a variable resistor 212, and an upper electrode 213 are laminated in this order. The resistance value of the variable resistive element R can be reversibly changed by applying a voltage pulse between the upper electrode 213 and the lower electrode 211. Data can be stored by changing the resistance state by this reversible resistance changing action (referred to as the switching action" occasionally hereinafter). In addition, here, a description will be made assuming that when the variable resistive element R is in a low resistance state, its state is in a programmed state, and when the variable resistive element R is in a high resistance state, its state is an erased state.

FIG. 12 is a cross-sectional schematic view of one memory cell $M_R$ in the memory cell array $A_R$ shown in FIG. 10. As described above, the one memory cell $M_R$ is composed of the transistor T and the variable resistive element R.

The transistor T is composed of a gate insulation film 203 and a gate electrode 204 laminated on a semiconductor substrate 201, and a drain diffusion region 205 and a source diffusion region 206 formed in the semiconductor substrate 201, and an element isolation region 202 to electrically isolate the transistors T is formed between the transistors T. In FIG. 12, a first interlayer insulation film 207 made of BPSG (Boron Phosphorous Silicate Glass) is formed on the semiconductor substrate 101 and the transistor T.

The variable resistive element R is formed on the first interlayer insulation film 207 in FIG. 12, and similar to FIG. 11, composed of the lower electrode 211 composed of a TiN film 211b having a thickness of 100 nm and a Ti film 211a having a thickness of 50 nm, the variable resistor 212 composed of a cobalt oxide having a thickness of 5 to 50 nm, and the upper electrode 213 composed of a Ta film having a thickness of 100 nm, which are laminated in this order. In addition, the lower electrode 211 is electrically connected to the drain diffusion region 205 of the transistor T through a contact electrode 208 made of conductive metal. In addition, the variable resistor 212 may be composed of a nickel oxide or tantalum oxide, or an oxide of transition metal element such as an zinc oxide or niobium oxide, instead of the cobalt oxide. In addition, the lower electrode 211 and the upper electrode 213 may be composed of a titanium nitride or materials such as Pt, Ir, Os, Ru, Rh, Pd, Al, and W. In FIG. 12, a second interlayer insulation film 209 having a thickness of 50 to 60 nm is formed on the first interlayer insulation film 207 and the variable resistive element R.

Furthermore, referring to FIG. 12, the gate electrode 204 of the transistor T serves as the word line WLi. In addition, a source line wiring 215 serving as the source line SL is made of TiN/Al—Si/TiN/Ti and formed on the second interlayer insulation film 209, and electrically connected to the source diffusion region 206 of the transistor T through a contact electrode 214. In addition, a bit line wiring 217 serving as the bit line BLi is formed on the second interlayer insulation film 209 and electrically connected to the upper electrode 213 of the variable resistive element R through a contact electrode 216. In addition, a third interlayer insulation film 218 is formed on the source wiring 215, the bit line wiring 217 and the second interlayer insulation film 209, a fourth interlayer insulation film 219 is formed on the third interlayer insulation film 218, a surface protection film 220 is made of a SiN film on the fourth interlayer insulation film 219.

As shown in FIG. 12, since the transistor T and the variable resistive element R are arranged in series, the transistor T of the memory cell $M_R$ selected by the voltage change of the word line WLi is turned on, and only the variable resistive element R of the memory cell $M_R$ selected by the voltage change of the bit line BLi can be programmed or erased selectively.

Hereinafter, a description will be made of each action of programming, reading, and erasing. In addition, the description will be made of a case where the structure and the material of the variable resistive element R are provided so that its characteristics become asymmetric, and voltage pulses having different polarities are applied between the programming action and the erasing action.

First, a description will be made of the programming action of the variable resistive element R in the memory cell $M_R$. To perform the programming action of the variable resistive element R, a predetermined programming row voltage, 2V, for example is applied to the word line WLi (i=1 to m) connected to the programming target cell $M_R$ which is a memory cell $M_R$ to be programmed, and 0V is applied to the word line WLi other than the word line WLi connected to the programming cell $M_R$. In addition, a predetermined programming column voltage, 2V, for example is applied to the bit line BLj (j=1 to n) connected to the programming target cell $M_R$, and 0V is applied to the bit line BLj other than the bit line BLj connected to the programming target cell $M_R$. Furthermore, 0V is applied to the source line SL. In addition, the programming row voltage applied to the word line WLi connected to the programming target cell $M_R$ is set so as to be higher than a value (threshold voltage value of the switching action) which causes the resistance value of the variable resistive element R to be changed by a voltage difference between both ends of the variable resistive element R so that the variable resistive element R becomes the low resistance state.

Thus, the voltage having the positive polarity is applied to the variable resistive element R of the programming target cell $M_R$, and the resistance value is reduced and the low resistance state is implemented. In addition, the voltage is not applied to the non-programming target cell $M_R$ other than the programming target cell $M_R$, so that the programming is not performed therein.

In addition, since the programming characteristics vary due to the variation in production process in the RRAM memory cell $M_R$ similar to the ETOX cell, a programming verifying action is performed after the programming action.

Next, a description will be made of the reading action of the variable resistive element R in the memory cell $M_R$. To perform the reading action in the variable resistive element R, a predetermined reading row voltage, 2V, for example is applied to the word line WLi (i=1 to m) connected to the reading target cell $M_R$ which is a memory cell $M_R$ to be read, and 0V is applied to the word line WLi other than the word line WLi connected to the reading target cell $M_R$. In addition, a predetermined reading column voltage, 0.7V, for example is applied to the bit line BLj (j=1 to n) connected to the reading target cell $M_R$, and 0V is applied to the bit line BLj other than the bit line BLj connected to the reading target cell $M_R$. Furthermore, 0V is applied to the source line SL. In addition, the reading row voltage applied to the word line WLi connected to the reading target cell $M_R$ is set such that the voltage difference between both ends of the variable resistive element R is smaller than the threshold voltage value of the switching action so that the resistance value of the variable resistive element R is not changed.

When the variable resistive element R of the reading target cell $M_R$ is in the low resistance state, the value of the current flowing in the memory cell $M_R$ is large, and when the variable resistive element R is in the high resistance state, the value of the current flowing in the memory cell $M_R$ is small, so that the state of the memory cell can be detected by detecting the value of the current flowing in the memory cell $M_R$.

Next, a description will be made of the erasing action of the memory cell $M_R$. To perform the erasing action in the variable resistive element R, a predetermined erasing row voltage, 2V, for example is applied to the word line WLi (i=1 to m) connected to the erasing target cell $M_R$ which is a memory cell $M_R$ to be erased, and 0V is applied to the word line WLi other than the word line WLi connected to the erasing target cell $M_R$. In addition, 0V is applied to the bit line BLj (j=1 to n) connected to the erasing target cell $M_R$, and 2V is applied to the bit line BLj other than the bit line BLj connected to the erasing target cell $M_R$. Furthermore, a predetermined source voltage, 2V, for example is applied to the source line SL.

Thus, the voltage having the negative polarity is applied to the variable resistive element R of the erasing target cell $M_R$, and the resistance value is increased and the high resistance state is implemented. In addition, the voltage is not applied to the variable resistive element R of the non-erasing target cell $M_R$ other than the erasing target cell $M_R$, so that the erasing action is not performed. In addition, the erasing row voltage applied to the word line WLi connected to the erasing target cell $M_R$ is set so that the transistor T of the erasing target cell $M_R$ is turned on, and the source voltage applied to the source line SL is set so that the voltage difference between both ends of the variable resistive element R of the erasing target cell $M_R$ becomes larger than the threshold voltage value of the switching action.

In addition, although the description has been made of the case where the voltage pulses having different polarities are applied between the programming action and the erasing action in the RRAM, as another method of changing the resistance value of the variable resistive element R in the memory cell $M_R$ of the RRAM, voltage pulses having different pulse widths may be applied between the programming action and the erasing action.

In addition, still another method of changing the resistance value of the variable resistive element R in the memory cell $M_R$ of the RRAM includes a nonvolatile semiconductor memory device in which the value of a variable resistive element R of a memory cell $M_R$ is changed by switching the load resistance characteristics of a load circuit such as a row decoder, a column decoder, a load resistance characteristics variable circuit, and a synthetic circuit such as parasitic resistance of a signal wiring connecting the above circuits, between at the time of programming action and at the time of erasing action (refer to U.S. Pat. No. 7,433,222, for example).

The above nonvolatile semiconductor memory device is configured such that the load resistance characteristics variable circuit is provided between a voltage generating circuit and the row decoder, and the load resistance characteristics of the load circuit electrically connected to a selected memory cell in series are switched between at the time of programming action and at the time of erasing action. In addition, detailed principle and action are described in the above patent document.

Meanwhile, the programming speed and the erasing speed of the RRAM are several tens of nanoseconds when a voltage of 1.5V to 3V is applied to the variable resistive element R, which is higher than those in the flash memory. Therefore, the erasing action of the RRAM is not necessarily performed by the block and can be performed by the bit unlike the flash memory. Thus, similar to the RRAM disclosed in the above patent document, the programming action, the reading action, and erasing action can be performed in the same cycle in the RRAM in which the programming action and the erasing action can be performed at the same time.

Recently, since the capacity of application software or data tends to increase, it is desired to speed up the writing action of the data in the nonvolatile memory such as the above flash memory and RRAM.

In addition, some flash memories have the burst function that executes the programming actions continuously by a plurality of programming commands, so that a time taken for the programming actions is increased as a whole, in proportion to the number of programming commands in the burst function in the flash memory. In this case, as described above, since the capacity of the application software and data tends to increase, the number of programming commands in the burst function tends to increase, and it is considered that the time taken for the writing actions as is considerably increased as a whole in the future. Therefore, it is desired to reduce the time taken for the writing actions in the flash memory having the burst function especially.

Meanwhile, a time taken for the writing action is shorter in the RRAM than the flash memory. However, similar to the flash memory, when the RRAM has the burst function, it is expected that the time taken for the writing actions is increased as a whole in the future because the capacity of the application software and data tends to increase. Therefore, similar to the flash memory, the time taken for the writing action is desirably reduced in the RRAM having the burst function.

SUMMARY OF THE INVENTION

The present invention was made in view of the above problems and it is an object of the present invention to provide a nonvolatile semiconductor memory device capable of performing a writing action for a memory cell at high speed.

As a first characteristic, a nonvolatile semiconductor memory device according to the present invention in order to attain the above object comprising: a memory cell array having a first sub-bank having a plurality of nonvolatile memory cells arranged in the form of a matrix in which first terminals of the memory cells on the same row are connected to a common word line, and second terminals of the memory cells on the same column are connected to a common bit line, and a second sub-bank having the same configuration as that of the first sub-bank; a row decoder shared by the first sub-bank and the second sub-bank and arranged to apply a voltage to the corresponding word lines in the first sub-bank and the second sub-bank at the same time; a first column decoder arranged to apply a voltage to the bit line of the first sub-bank; a second column decoder arranged to apply a voltage to the bit line of the second sub-bank; and a control circuit arranged to control a programming action, a programming verifying action, a re-programming action for the memory cell determined such that the programming action has not been normally performed in the programming verifying action, the programming verifying action for the re-programming action, an erasing action, an erasing verifying action, a re-erasing action for the memory cell determined such that the erasing action has not been normally performed in the erasing verifying action, and the erasing verifying action for the re-erasing action, in the memory cell array, wherein the control circuit performs the programming action to the first sub-bank and a reading action for the programming verifying action to the second sub-bank in a first action cycle, and performs the reading action for the programming verifying action to the first sub-bank and the programming action to the second sub-bank in a second action cycle, and the control circuit executes the first action cycle and the second action cycle alternately.

As a second characteristic, in the nonvolatile semiconductor memory device according to the present invention having the above characteristic, the control circuit performs: the re-programming action to the first sub-bank, and a reading action for the programming verifying action for the re-programming action to the second sub-bank in the first action cycle; and the reading action for the programming verifying action for the re-programming action to the first sub-bank, and the re-programming action to the second sub-bank in the second action cycle.

As a third characteristic, in the nonvolatile semiconductor memory device according to the present invention having any one of the above characteristics, the control circuit performs: the erasing action to the first sub-bank, and a reading action for the erasing verifying action to the second sub-bank in the first action cycle; and the reading action for the erasing verifying action to the first sub-bank, and the erasing action to the second sub-bank in the second action cycle.

As a fourth characteristic, in the nonvolatile semiconductor memory device according to the present invention having the above characteristics, the control circuit performs: the re-erasing action to the first sub-bank, and a reading action for the erasing verifying action for the re-erasing action to the second sub-bank in the first action cycle; and the reading action for the erasing verifying action for the re-erasing action to the first sub-bank, and the re-erasing action to the second sub-bank in the second action cycle.

As a fifth characteristic, in the nonvolatile semiconductor memory device according to the present invention having the first characteristic, the memory cell array includes a plurality of pairs of sub-banks each composed of the first sub-bank and the second sub-bank, the first column decoder and the second column decoder are provided for each pair of sub-banks, and the control circuit performs, in a middle cycle between the first action cycle and the second action cycle in the predetermined pair of sub-banks, at least one of the first action cycle to the one sub-bank and the second action cycle to the other sub-bank in a pair of sub-banks other than the predetermined pair of sub-banks, and at the same time performs at least one of the re-programming action to the one sub-bank and the reading action for the programming verifying action for the re-programming action to the other sub-bank in the predetermined pair of sub-banks in the above middle cycle.

As a sixth characteristic, in the nonvolatile semiconductor memory device according to the present invention having the above characteristics, the control circuit performs: the erasing action to the first sub-bank, and a reading action for the erasing verifying action to the second sub-bank in the first action cycle; and the reading action for the erasing verifying action to the first sub-bank, and the erasing action to the second sub-bank in the second action cycle.

As a seventh characteristic, in the nonvolatile semiconductor memory device according to the present invention having the above characteristics, the control circuit performs, in a middle cycle between the first action cycle and the second action cycle in the predetermined pair of sub-banks, at least one of the first action cycle to the one sub-bank and the second action cycle to the other sub-bank in a pair of sub-banks other than the predetermined pair of sub-banks, and at the same time performs at least one of the re-erasing action to the one sub-bank and the reading action for the erasing verifying action for the re-erasing action to the other sub-bank in the predetermined pair of sub-banks in the above middle cycle.

As an eighth characteristic, in the nonvolatile semiconductor memory device according to the present invention having any one of the above characteristics, the control circuit has a burst function for continuously performing the programming action and the programming verifying action for a memory cell group composed of a predetermined number of memory cells based on a burst length, in response to one programming command, and the control circuit automatically allocates addresses from a head address to following addresses in the memory cell group designated by the programming command to the first sub-bank and the second sub-bank, in the programming action by the burst function.

As a ninth characteristic, in the nonvolatile semiconductor memory device according to the present invention having any one of the above characteristics, the control circuit has a burst function for continuously performing the erasing action and the erasing verifying action for a memory cell group composed of a predetermined number of memory cells based on a burst length, in response to one erasing command, and the control circuit automatically allocates addresses from a head address to following addresses in the memory cell group designated by the erasing command to the first sub-bank and the second sub-bank, in the erasing action by the burst function.

Since the nonvolatile semiconductor memory device having the above characteristics is configured such that the row decoder is provided for the first sub-bank and the second sub-bank in common, and the programming action to the one sub-bank and the reading action for the programming verifying action to the other sub-bank are performed in the same cycle, the programming time for the programming action and the programming verifying action in the memory cell array can be reduced as a whole.

In addition, since the nonvolatile semiconductor memory device having the above characteristics is configured such that the row decoder is provided for the first sub-bank and the second sub-bank in common, a sense amplifier for the reading action can be shared, and the programming time for the programming action and the programming verifying action in the memory cell array can be reduced as a whole, with a simple configuration.

In addition, since the nonvolatile semiconductor memory device having the above characteristics is configured such that the programming action and the reading action for the programming verifying action are performed in the same cycle, power consumption can be equalized.

Since the nonvolatile semiconductor memory device having the third and sixth characteristics is configured such that the row decoder is provided for the first sub-bank and the second sub-bank in common, and the erasing action to the one sub-bank and the reading action for the erasing verifying action to the other sub-bank are performed in the same cycle, the erasing time for the erasing action and the erasing verifying action in the memory cell array can be reduced as a whole. In addition, when the programming target cell and the erasing target cell exist in the one sub-bank, especially, in the nonvolatile semiconductor memory device capable of performing the programming action and the erasing action by the bit at the same time, in the RRAM changing the load resistance characteristics of the load circuit between at the time of programming action and at the time of erasing action, for example, the time taken for the programming action and the erasing action can be reduced as a whole.

DETAILED DESCRIPTION OF THE INVENTION

A description will be made of embodiments of nonvolatile semiconductor memory devices according to the present invention (referred to as the "device of the present invention" occasionally hereinafter) with reference to the drawings.

First Embodiment

Figure 1:
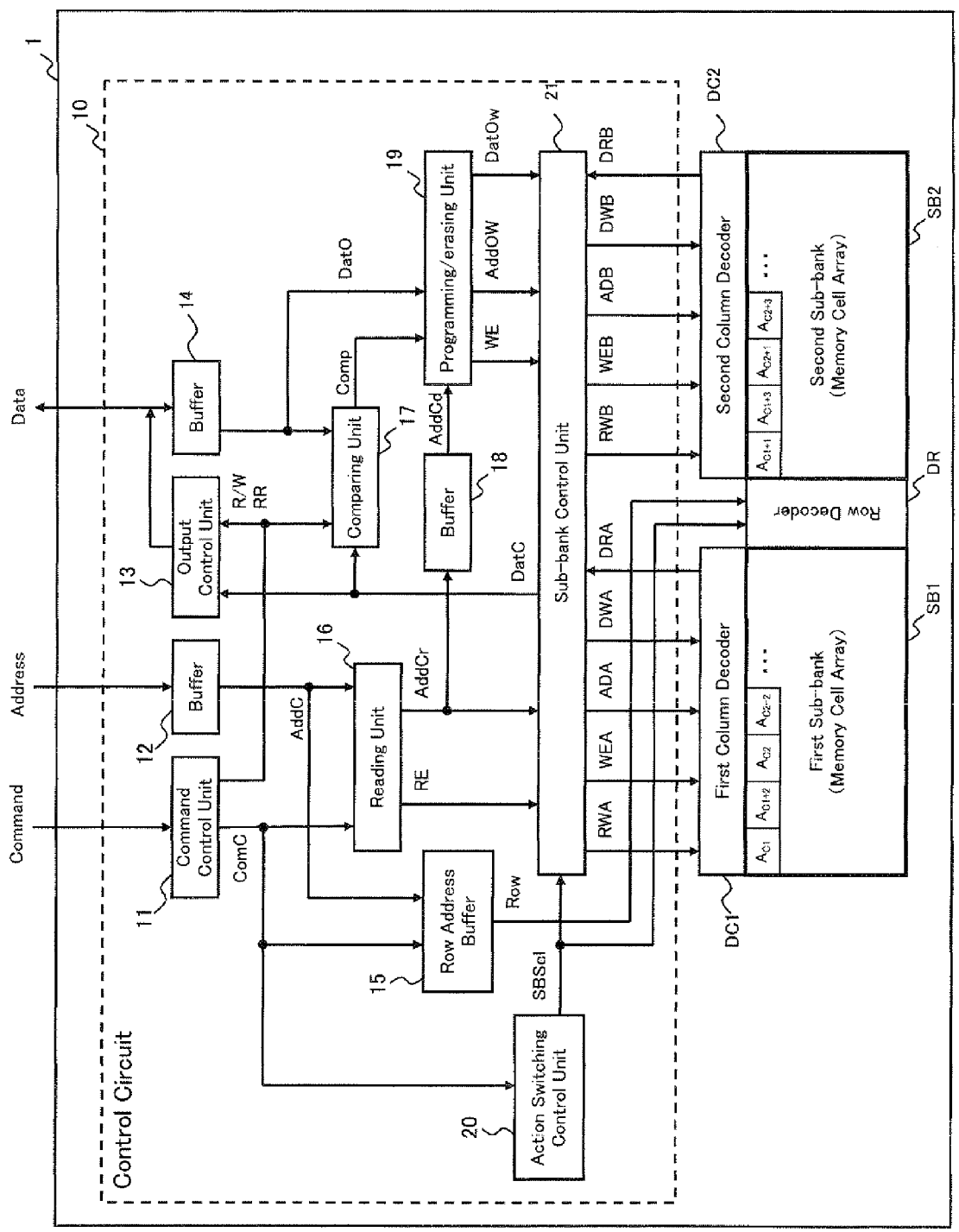
FIG. 1 is a schematic part block diagram showing a schematic configuration example of a nonvolatile semiconductor memory device according to the present invention.
Figure 2:
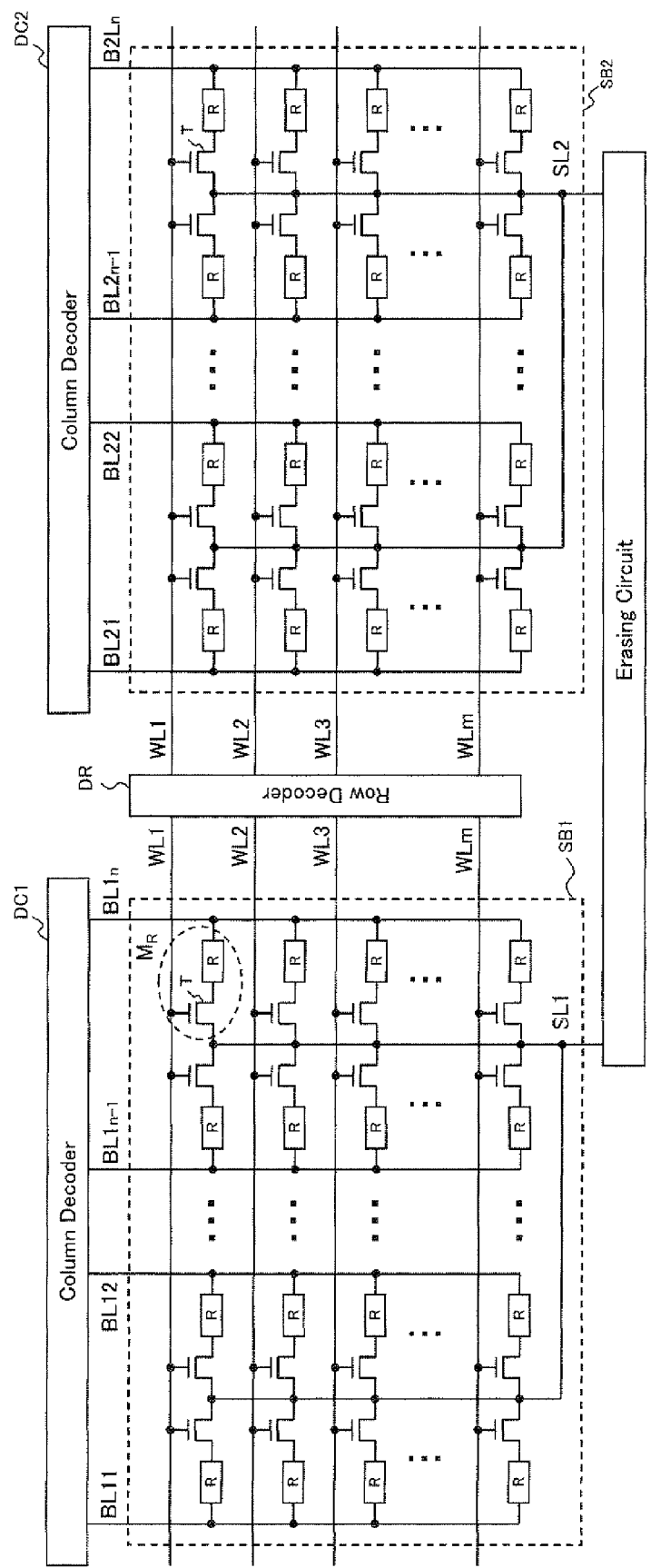
FIG. 2 is a schematic part block diagram showing a schematic configuration example of a memory cell array in the nonvolatile semiconductor memory device according to the present invention.

A first embodiment of the device of the present invention will be described with reference to FIGS. 1 to 4. Here, FIG. 1 shows a schematic configuration example of a device 1 of the present invention, and FIG. 2 shows a configuration of a memory cell array of the device 1 of the present invention. In addition, this embodiment will be described assuming that the device 1 of the present invention is an RRAM.

As shown in FIG. 1, the device 1 of the present invention includes a memory cell array composed of two sub-banks such as a first sub-bank SB1 and a second sub-bank SB2, a row decoder DR which applies a voltage to word lines WL1 to WLm of the first sub-bank SB1 and the second sub-bank SB2 based on the instruction from a control circuit 10 which will be described below, a first column decoder DC1 which applies a voltage to bit lines BL11 to BL1n in the first sub-bank SB1 based on the instruction from the control circuit 10 which will be described below, a second column decoder DC2 which applies a voltage to bit lines BL21 to BL2n in the second sub-bank SB2 based on the instruction from the control circuit 10 which will be described below, and the control circuit 10 which controls actions including a programming action and programming verifying action. In addition, according to this embodiment, the device 1 of the present invention has a burst function that executes a plurality of programming commands continuously.

As shown in FIG. 2, the first sub-bank SB1 of the memory cell array is composed of a plurality of memory cells $M_R$ having a transistor T and a variable resistive element R in which one end of the variable resistive element R is connected to a drain terminal of the transistor T. In the first sub-bank SB1, m×n memory cells $M_R$ are arranged in the form of a matrix, gate terminals (corresponding to first terminals) of the transistors T in the memory cells $M_R$ on the same row are connected to the same word line WLi (i=1 to m), one ends (corresponding to second terminals) of the variable resistive element R in the memory cells $M_R$ on the same column are connected to the same bit line BL1j (j=1 to n), and source terminals of the transistors T in all of the memory cells $M_R$ in the first sub-bank SB1 are connected to a common source line SL1. The first sub-bank SB1 according to this embodiment is configured such that the memory cell $M_R$ is selected or not selected based on a voltage application state to the gate terminal (first terminal) of the transistor T, and actions (programming action, reading action, and erasing action) of the memory cell $M_R$ are switched based on a voltage application state to the one terminal (second terminal) of the variable resistive element R. In addition, switching between the programming action and the erasing action is performed by applying voltage pulses having different polarities, or applying voltage pulses having different pulse widths, or switching load resistance characteristics of a load circuit. Here, the switching method between the programming action and the erasing action is not the gist of the present invention and disclosed in detail in U.S. Pat. No. 7,433,222.

As shown in FIG. 2, the second sub-bank SB2 of the memory cell array is composed of a plurality of memory cells $M_R$ similar to the first sub-bank SB1, in which m×n memory cells $M_R$ are arranged in the form of a matrix, gate terminals (corresponding to first terminals) of the transistors T in the memory cells $M_R$ on the same row are connected to the same word line WLi (i=1 to m), one ends (corresponding to second terminals) of the variable resistive element R in the memory cells $M_R$ on the same column are connected to the same bit line BL$2j$ (j=1 to n), and source terminals of the transistors T in all of the memory cells $M_R$ in the second sub-bank SB2 are connected to a common source line SL2. In addition, similar to the first sub-bank SB1, the second sub-bank SB2 is configured such that the memory cell $M_R$ is selected or not selected based on a voltage application state to the gate terminal (first terminal) of the transistor T, and actions (programming action, reading action, and erasing action) of the memory cell $M_R$ are switched based on a voltage application state to the one terminal (second terminal) of the variable resistive element R.

According to this embodiment, even-number addresses ($A_{C1}$, $A_{C1+2}$, $A_{C2}$, $A_{C2+2}$) are allocated to the first sub-bank SB1, and odd-number addresses ($A_{C1+1}$, $A_{C1+3}$, $A_{C2+1}$, $A_{C2+3}$) are allocated to the second sub-bank SB2. In addition, the address allocation is not limited to this, and the addresses may be alternately allocated every predetermined number such that the addresses are alternately allocated every two addresses ($A_{C1}$ and $A_{C1+1}$ are allocated to the first sub-bank SB1, and $A_{C1+2}$ and $A_{C1+3}$ are allocated to the second sub-bank SB2).

The control circuit 10 includes a command control unit 11 receiving an externally inputted command and controlling each circuit unit, a buffer 12 storing an externally inputted address signal, an output control unit 13 controlling output data outputted from the first sub-bank SB1 or the second sub-bank SB2, a buffer 14 storing the output data and externally inputted data, a row address buffer 15 storing a row address included in the address signal stored in the buffer 12, a reading unit 16 controlling a reading action, a comparing unit 17 comparing the output data with programming data (expectation value of the externally inputted data), a buffer 18 storing an address signal Adder from the reading unit 16, a programming/erasing unit 19 controlling a programming action, a programming verifying action, an erasing action, and an erasing verifying action, an action switching control unit 20, and a sub-bank control unit 21.

When a signal Comp outputted from the comparing unit 17 shows that the programming action has not been normally completed, the programming/erasing unit 19 stores the address and the programming data of the programming target cell $M_R$ in which the programming action has not normally completed, with respect to each sub-bank, and outputs a signal WE showing that programming action has not been normally performed, a signal AddOW showing the address of the programming target cell $M_R$, and a signal DatOw showing the programming data, to the sub-bank control unit 21.

The sub-bank control unit 21 outputs a signal RWA showing which action of programming, erasing, or reading is to be executed, and when the signal RWA shows that the programming action or the erasing action is to be executed, it outputs a signal WEA showing the bit number of the data to be programmed or erased, and a signal ADA showing a column address, and a signal DWA showing programming data, to the first column decoder DC1 in the first sub-bank SB1, and it receives a signal DRA showing reading data from the first column decoder DC1.

In addition, according to this embodiment, a description will be made of a case where under the condition that the memory cells $M_R$ in the first sub-bank SB1 and the second sub-bank SB2 are all in an erased state "1", a programmed state "0" is implemented. In addition, when the expectation value of the external input data does not coincide with the value of the memory cell $M_R$, it is determined that programming data exists and the programming action or the erasing action is performed. Since it is assumed that the memory cells $M_R$ are all in the erased state "1" in this embodiment as an initial state, the memory cell $M_R$ whose expectation value of the external input data shows the programmed state "0" is determined as the programming target cell and programmed. More specifically, in this embodiment, when it is assumed that the external input data D0 to D7 is "00000001", the memory cell $M_R$ to which the address $A_{c2+3}$ is allocated in the second sub-bank SB2 is the programming target cell, and when the signal ADA shows the column address $A_{c2+3}$, the signal DWA shows the programmed state "0".

Similarly, the sub-bank control unit 21 outputs a signal RWB showing which action of programming, erasing, or reading is to be executed, and when the signal RWB shows that the programming action or the erasing action is to be executed, it outputs a signal WEB showing the bit number of the data to be programmed or erased, and a signal ADB showing a column address, and a signal DWB showing programming data, to the second column decoder DC2 in the second sub-bank SB2, and it receives a signal DRB showing reading data, from the first column decoder DC1.

Figure 3:
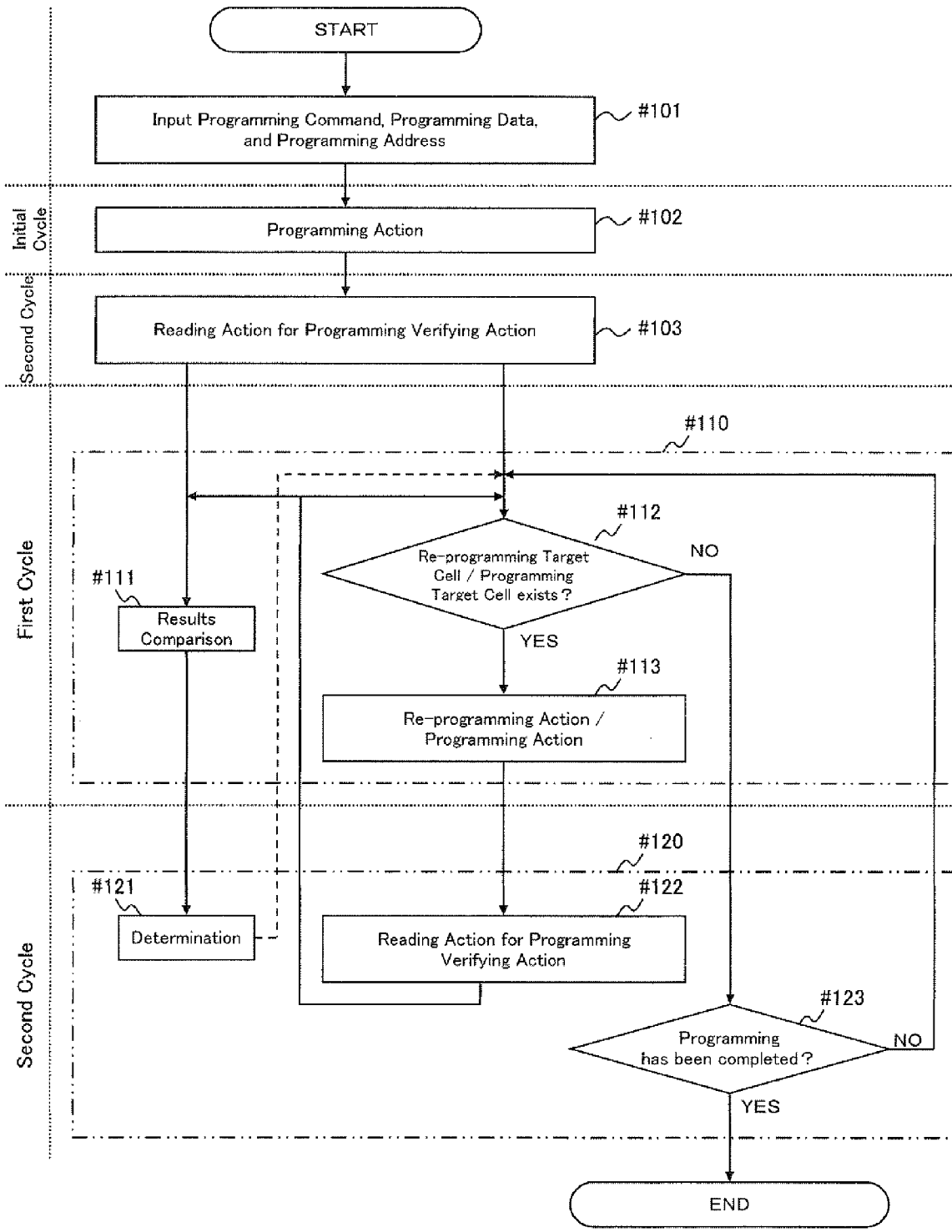
FIG. 3 is a flowchart showing procedures of a programming action and a programming verifying action of the nonvolatile semiconductor memory device according to the present invention.

Hereinafter, the processing action of the device 1 of the present invention will be described with reference to FIGS. 3 and 4. Here, FIG. 3 shows a flowchart of procedures of the programming action and the programming verifying action for the first sub-bank SB1 of the device 1 of the present invention, and FIG. 4 shows a timing chart of the programming action and the programming verifying action of the device 1 of the present invention.

In addition, according to this embodiment, the device 1 of the present invention is configured to alternately execute a first action cycle to perform the programming action in the first sub-bank SB1 and the reading action for the programming verifying action in the second sub-bank SB2, and a second action cycle to perform the reading action for the programming verifying action in the first sub-bank SB1 and the programming action in the second sub-bank SB2. Although the action procedure of the first sub-bank SB1 is shown in FIG. 3, as for the action procedure of the second sub-bank SB2, the first cycle and the second cycle are exchanged in a corresponding relationship between each cycle and each action in the action procedure of the first sub-bank SB1.

Figure 4A:
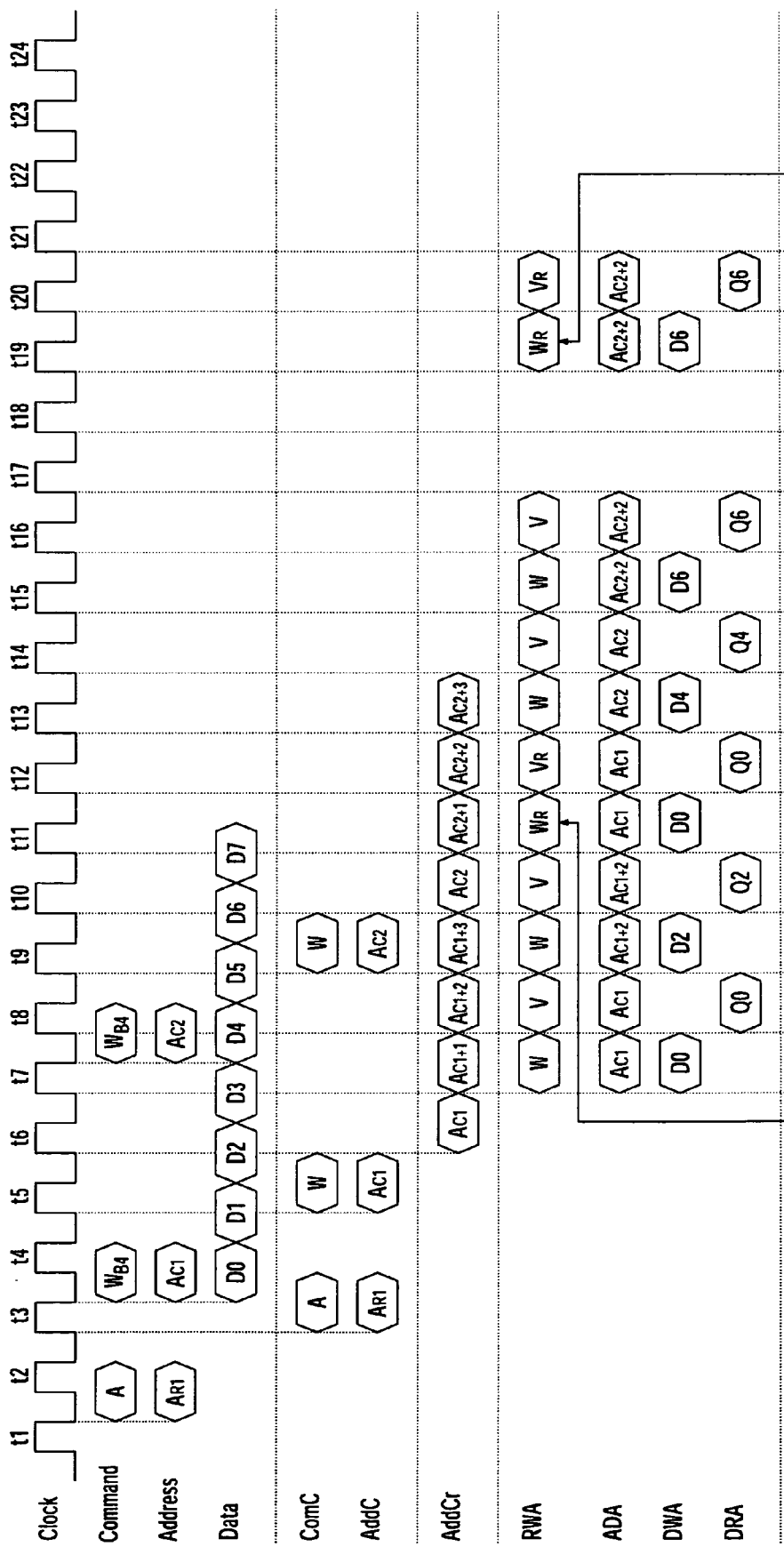
FIG. 4 is a timing chart showing the programming action and the programming verifying action of the nonvolatile semiconductor memory device according to the present invention.
Figure 4B:
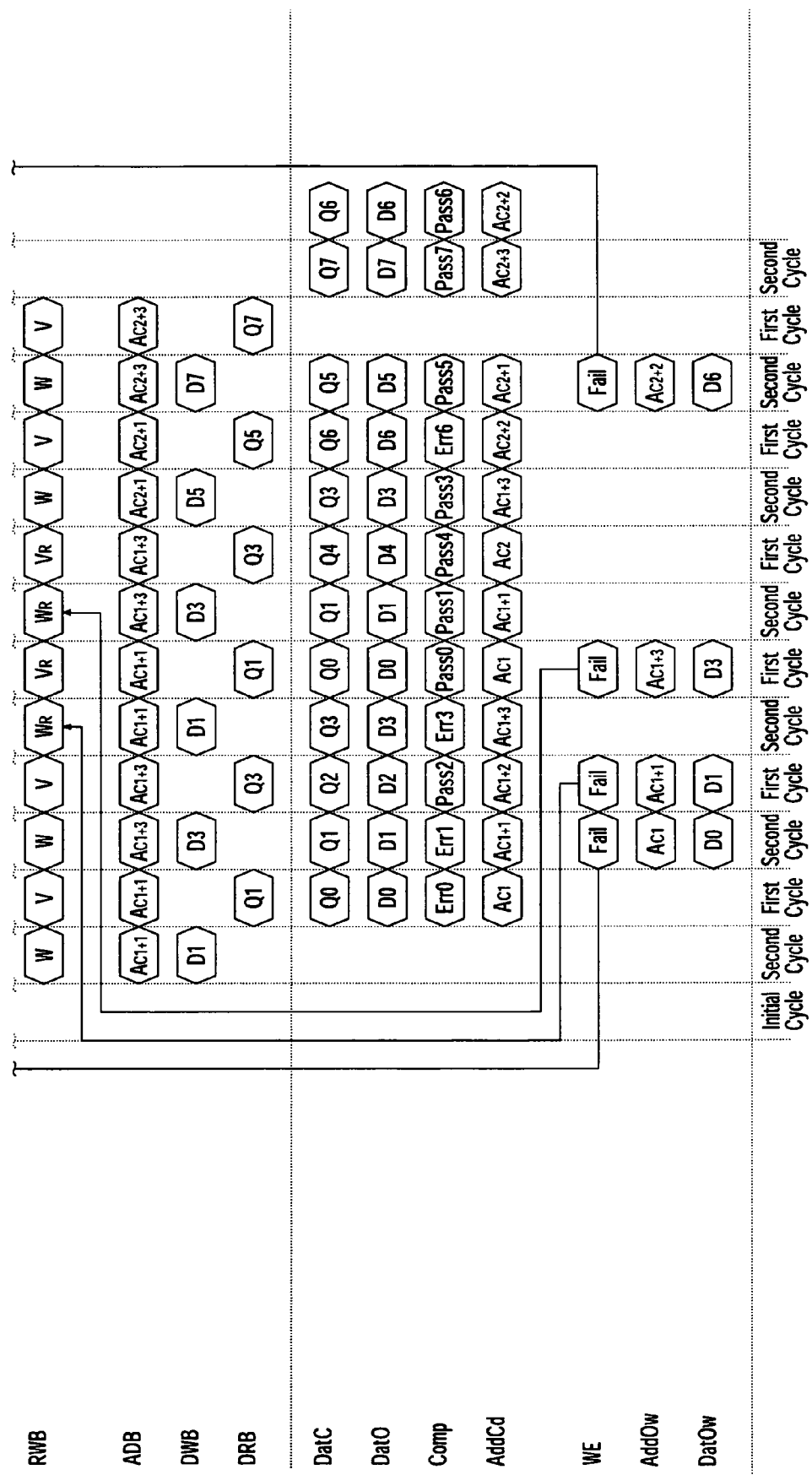

FIG. 4 shows a case where a programming command $W_{B4}$ to program four programming data continuously (burst length is 4) is inputted by the burst function. In addition, a description will be made assuming that the programming data consists of 1 bit in this embodiment for the purpose of easier understanding. More specifically, FIG. 4 shows a case where the burst function continuously issues the programming command $W_{B4}$ to program programming data D0 to D3 in the memory cell $M_R$ in the first sub-bank SB1 designated by a row address $A_{R1}$ and the programming address (column address) $A_{C1}$, and the programming command $W_{B4}$ to program programming data D4 to D7 in the memory cell $M_R$ in the second sub-bank SB2 designated by a row address $A_{R1}$ and a programming address $A_{C2}$. The column addresses of the programming data D1 to D3 are automatically set to $A_{C1+1}$, $A_{C1+2}$, and $A_{C1+3}$ by the burst function, and the column addresses of the programming data D5 to D7 are automatically set to $A_{C2+1}$, $A_{C2+2}$, and $A_{C2+3}$ by the burst function. In addition, the programming data D0 to D7 are sequentially inputted to the buffer 14 so that they are not changed at a rising timing of clock signals in synchronization with the clock signals in FIG. 4.

In FIG. 4, as for the signals RWA and RWB, "W" means the programming action, "V" means the reading action for the programming verifying action, "$W_R$" means a re-programming action when a programming verifying result is "Fail", and "$V_R$" means a reading action for the programming verifying action for the re-programming action.

When a programming command A is inputted by the burst function, and an address $A_{R1}$ showing the row address is inputted to the buffer 12, the device 1 of the present invention according to this embodiment starts the programming action (at time t2 in step #101). The row address buffer 15 outputs the address $A_{R1}$ stored in the buffer 12, to the row decoder DR. Then, a first programming command W is inputted to the command control unit 11, and a programming address (column address) is stored in the buffer 12, and external input data is stored in the buffer 14. More specifically, in FIG. 4, when the clock rises during time t3 to time t4, the programming command W is inputted to the command control unit 11, the programming address $A_{C1}$ is inputted to the buffer 12, and the programming data D0 is inputted to the buffer 14.

The sub-bank control unit 21 of the device 1 of the present invention performs the programming action in the first sub-bank SB1 in an initial cycle (during time t7 to time t8 in FIG. 4) (in step #102). More specifically, the transistor of the programming target cell $M_R$ in the first sub-bank SB1 designated by the programming address $A_{C1}$ is turned on at time t7 in FIG. 4, and a programming voltage to change the resistance value of the variable resistive element R to a programmed state is applied based on the programming data D0.

The sub-bank control unit 21 of the device 1 of the present invention performs the reading action for the programming verifying action in the programming target $M_R$ in the first sub-bank SB1 in an initial second cycle (corresponding to the second action cycle during time t8 to time t9 in FIG. 4) (in step #103). More specifically, the programming target cell $M_R$ in the first sub-bank SB1 designated by the programming address $A_{C1}$ is read and reading data Q0 is outputted as data DatC.

At this time, concurrently, the sub-bank control unit 21 of the device 1 of the present invention performs the programming action in the programming target cell $M_R$ in the second sub-bank SB2 (in step #102). More specifically, a programming voltage corresponding to the programming data D1 is applied to the programming target cell $M_R$ in the second sub-bank SB2 designated by a programming address $A_{C1+1}$.

The sub-bank control unit 21 of the device 1 of the present invention performs the programming action by applying a voltage based on the programming data D2 to the programming target cell $M_R$ designated by a programming address $A_{C1+2}$ in the next first cycle (corresponding to the first action cycle during time t9 to time t10 in FIG. 4) as the first programming action for the programming address $A_{C1+2}$ in the first sub-bank SB1 (YES in step #112). In addition, the comparing unit 17 of the device 1 of the present invention compares the value of the data DatC read in the last second cycle with the value of data DatO, that is, compares the value of the data Q0 with the value of the data D0 during time t9 to time t10 in FIG. 4, and outputs its result to the programming/erasing unit 19 as a result signal Comp (in step #111). The result signal Comp of "Err0" showing that the value of the data Q0 does not coincide with that of the data D0 is outputted during time t9 to time t10 in FIG. 4.

Concurrently, the sub-bank control unit 21 of the device 1 of the present invention performs the reading action for the programming verifying action in the programming target cell $M_R$ designated by the programming address $A_{C1+1}$ as the action in the second sub-bank SB2, and outputs reading data Q1 as the data DatC (in step #103).

The sub-bank control unit 21 of the device 1 of the present invention performs the reading action for the programming verifying action in the programming target cell $M_R$ designated by a programming address $A_{C1+2}$ as the action for the first sub-bank SB1 in the next second cycle (corresponding to the second action cycle during time t10 to time t11 in FIG. 4) and outputs reading data Q2 as the data DatC (in step #122). In addition, the programming/erasing unit 19 of the device 1 of the present invention determines whether or not the programming action in the programming target cell $M_R$ has been normally completed, based on the result signal Comp outputted from the comparing unit 17 in the last first cycle (in step #121), and when it is determined the programming action has not been normally completed, the unit 19 outputs the signal WE showing that the programming action has not been normally completed, the signal AddOw showing the address of the programming target cell $M_R$, and the signal DatOw showing the programming data to the sub-bank control unit 21. More specifically, during time t10 to time t11 in FIG. 4, the programming/erasing unit 19 determines that the result of the programming and verifying action is "Fail" because the result signal Comp outputted from the comparing unit 17 in the last first cycle is "Err0", and outputs the signal WE, the signal AddOw showing the address $A_{C1}$, the signal DatOw showing the data D0 to the sub-bank control unit 21.

Concurrently, the sub-bank control unit 21 of the device 1 of the present invention performs the programming action by applying a voltage corresponding to the programming data D3 to the programming target cell $M_R$ designated by a programming address $A_{C1+3}$ as the first programming action for the programming address $A_{C1+3}$ in the second sub-bank SB2 (YES in step #112). In addition, the comparing unit 17 of the device 1 of the present invention compares the value of the data DatC (data Q1) read in the last first cycle with the value of the signal DatO (data D1), and outputs its result to the programming/erasing unit 19 as the result signal Comp (in step #111). The result signal Comp of "Err1" showing that the value of the data Q1 does not coincide with that of the data D1 is outputted during time t10 to time t11 in FIG. 4.

The sub-bank control unit 21 of the device 1 of the present invention performs the re-programming action in the re-programming target cell $M_R$ when the re-programming target cell $M_R$ exists to be re-programmed, or performs the programming action for the programming target cell $M_R$ when the re-programming target cell $M_R$ does not exist and programming data for another programming target cell $M_R$ exists, as the action in the first sub-bank SB1 during the next first cycle (corresponding to the first action cycle during time a1 to time t12 in FIG. 4) (YES in step #112). More specifically, since the signal WE, the signal AddOw showing the address $A_{C1}$, and the signal DatOw showing the data D0 are outputted from the programming/erasing unit 19 in the last second cycle, it is determined that the re-programming target cell $M_R$ exists, and the programming voltage for the re-programming action is applied to the re-programming target cell $M_R$ in the first sub-bank SB1 designated by the programming address $A_{C1}$ based on the programming data D0 during time t11 to time t12 in FIG. 4 (in step #113). In addition, the comparing unit 17 of the device 1 of the present invention compares the value of the data DatC (data Q2) read in the last second cycle with the value of signal DatO (data D2), and outputs its result to the programming/erasing unit 19 as the result signal Comp (in step #111). The result signal Comp of "Pass2" showing that the value of the data Q2 coincides with that of the data D2 is outputted during time t11 to time t12 in FIG. 4.

Concurrently, the sub-bank control unit 21 of the device 1 of the present invention performs the reading action for the programming verifying action in the programming target cell $M_R$ designated by the programming address $A_{C1+3}$ as the action in the second sub-bank SB2, and outputs reading data Q3 as the data DatC (in step #122). In addition, since the result signal Comp outputted from the comparing unit 17 in the last second cycle is "Err1", the programming/erasing unit 19 of the device 1 of the present invention determines that the result of the programming verifying action is "Fail" during time t11 to time t12 in FIG. 4, and outputs the signal WE, the signal AddOw showing the address $A_{C1+1}$, the signal DatOw showing the data D1 to the sub-bank control unit 21.

The sub-bank control unit 21 of the device 1 of the present invention performs the reading action for the programming verifying action for the re-programming action in the re-programming target cell $M_R$ designated by the programming address $A_{C1}$ as the action in the first sub-bank SB1 in the next second cycle (corresponding to the second action cycle during time t12 to time t13 in FIG. 4), and outputs the reading data Q0 as the data DatC (in step #122). In addition, since the result signal Comp outputted from the comparing unit 17 in the last first cycle is the "Pass2", the programming/erasing unit 19 of the device 1 of the present invention determines that the programming action in the programming target cell $M_R$ designated by the programming address $A_{C1+2}$ has been normally completed during time t12 to time t13 in FIG. 4, and it does not output the signal WE and the like to the sub-bank control unit 21.

Concurrently, since the signal WE, the signal AddOw showing the address $A_{C1+1}$, and the signal DatOw showing the data D1 are outputted from the programming/erasing unit 19 in the last first cycle, the sub-bank control unit 21 of the device 1 of the present invention determines that the re-programming target cell $M_R$ exists (YES in step #112), and applies the programming voltage for the re-programming action to the re-programming target cell $M_R$ in the second sub-bank SB2 designated by the programming address $A_{C1+1}$ based on the programming data D1, as the action for the second sub-bank SB2 (in step #113). In addition, the comparing unit 17 of the device 1 of the present invention compares the value of the data DatC (data Q3) read in the last first cycle with the value of signal DatO (data D3), and outputs its result to the programming/erasing unit 19 as the result signal Comp (in step #111). The result signal Comp of "Err3" showing that the value of the data Q3 does not coincide with that of the data D3 is outputted during time t12 to time t13 in FIG. 4.

The sub-bank control unit 21 of the device 1 of the present invention determines that the re-programming target cell $M_R$ does not exist as the action in the first sub-bank SB1 in the next first cycle (corresponding to the first action cycle during time t13 to time t14 in FIG. 4) because the signal WE has not been outputted from the programming/erasing unit 19 in the last second cycle. Furthermore, since the programming command $W_{B4}$ to program the data D4 to D7 to the address Ace is continuously inputted by the burst function, the sub-bank control unit 21 determines that the programming target cell $M_R$ exists (YES in step #112), and applies the programming voltage for the programming action to the programming target cell $M_R$ in the first sub-bank SB1 designated by the programming address $A_{C2}$ based on the programming data D4 (in step #113). In addition, the comparing unit 17 of the device 1 of the present invention compares the value of the data DatC (data Q0) read in the last second cycle with the value of the signal DatO (data D0), and outputs its result to the programming/erasing unit 19 as the result signal Comp (in step #111). The result signal Comp of "Pass0" showing that the value of the data Q0 coincides with that of the data D0 is outputted during time t13 to time t14 in FIG. 4.

Concurrently, the sub-bank control unit 21 of the device 1 of the present invention performs the reading action for the programming verifying action in the re-programming target cell $M_R$ designated by the programming address $A_{C1+1}$ as the action in the second sub-bank SB2, and outputs the reading data Q1 as the data DatC (in step #122). In addition, since the result signal Comp outputted from the comparing unit 17 in the last second cycle is "Err3", the programming/erasing unit 19 of the device 1 of the present invention determines that the result of the programming verifying action is "Fail" during time t13 to time t14 in FIG. 4, and outputs the signal WE, the signal AddOw showing the address $A_{C1+3}$, the signal DatOw showing the data D3 to the sub-bank control unit 21.

The sub-bank control unit 21 of the device 1 of the present invention performs the reading action for the programming verifying action in the programming target cell $M_R$ designated by the programming address $A_{C2}$ as the action in the first sub-bank SB1 in the next second cycle (corresponding to the second action cycle during time t14 to time t15 in FIG. 4) and outputs the reading data Q4 as the data DatC (in step #122). In addition, since the result signal Comp outputted from the comparing unit 17 in the last first cycle is the "Pass0", the programming/erasing unit 19 of the device 1 of the present invention determines that the programming action for the re-programming target cell $M_R$ designated by the programming address $A_{c1}$ has been normally completed during time t14 to time t15 in FIG. 4, and it does not output the signal WE and the like to the sub-bank control unit 21.

Concurrently, since the signal WE, the signal AddOw showing the address $A_{C1+3}$, and the signal DatOw showing the data D3 are outputted from the programming/erasing unit 19 in the last first cycle, the sub-bank control unit 21 of the device 1 of the present invention determines that the re-programming target cell $M_R$ exists (YES in step #112), as the action in the second sub-bank SB2, and applies the programming voltage for the re-programming action to the re-programming target cell $M_R$ in the second sub-bank SB2 designated by the programming address $A_{C1+3}$ based on the programming data D3 (in step #113). In addition, the comparing unit 17 of the device 1 of the present invention compares the value of the data DatC (data Q1) read in the last first cycle with the value of the signal DatO (data D1), and outputs its result to the programming/erasing unit 19 as the result signal Comp (in step #111). The result signal Comp of "Pass1" showing that the value of the data Q1 coincides with that of the data D1 is outputted during time t14 to time t15 in FIG. 4.

The sub-bank control unit 21 of the device 1 of the present invention determines that the re-programming target cell $M_R$ does not exist as the action in the first sub-bank SB1 in the next first cycle (corresponding to the first action cycle during time t15 to time t16 in FIG. 4) because the signal WE has not been outputted from the programming/erasing unit 19 in the last second cycle. Furthermore, since the programming address $A_{C2+2}$ is stored in the buffer 12 and the data D6 is stored in the buffer 14, the sub-bank control unit 21 determines that the programming target cell $M_R$ exists (YES in step #112), and applies the programming voltage for the programming action to the programming target cell $M_R$ in the first sub-bank SB1 designated by the programming address $A_{C2+2}$ based on the programming data D6 (in step #113). In addition, the comparing unit 17 of the device 1 of the present invention compares the value of the data DatC (data Q4) read in the last second cycle with the value of signal DatO (data D4), and outputs its result to the programming/erasing unit 19 as the result signal Comp (in step #111). The result signal Comp of "Pass4" showing that the value of the data Q4 coincides with that of the data D4 is outputted during time t15 to time t16 in FIG. 4.

Concurrently, the sub-bank control unit 21 of the device 1 of the present invention performs the reading action for the programming verifying action for the re-programming action in the re-programming target cell $M_R$ in the second sub-bank SB2 designated by the programming address $A_{C1+3}$ as the action in the second sub-bank SB2, and outputs the reading data Q3 as the data DatC (in step #122). In addition, since the result signal Comp outputted from the comparing unit 17 in the last second cycle is "Pass1", the programming/erasing unit 19 of the device 1 of the present invention determines that the programming action in the programming target cell $M_R$ designated by the address $A_{C2}$ has been normally completed during time t15 to time t16 in FIG. 4 and does not output the signal WE and the like to the sub-bank control unit 21.

The sub-bank control unit 21 of the device 1 of the present invention performs the reading action for the programming verifying action in the programming target cell $M_R$ in the first sub-bank SB1 designated by the programming address $A_{C2+2}$ as the action in the first sub-bank SB1 in the next second cycle (corresponding to the second action cycle during t16 to t17 in FIG. 4), and outputs reading data Q6 as the data DatC (in step #122). In addition, since the result signal Comp outputted from the comparing unit 17 in the last first cycle is the "Pass4", the programming/erasing unit 19 of the device 1 of the present invention determines that the programming action in the programming target cell $M_R$ designated by the programming address $A_{C2}$ has been normally completed during time t16 to time t17 in FIG. 4, and it does not output the signal WE and the like to the sub-bank control unit 21.

Concurrently, since the signal WE is not outputted from the programming/erasing unit 19 in the last first cycle, the sub-bank control unit 21 of the device 1 of the present invention determines that the re-programming target cell $M_R$ does not exist in the second sub-bank SB2, as the action in the second sub-bank SB2. In addition, since the address $A_{C2+1}$ is stored in the buffer 12 and the data D5 is stored in the buffer 14, the sub-bank control unit 21 determines that the programming target cell $M_R$ exists (YES in step #112), and applies the programming voltage for the programming action to the programming target cell $M_R$ in the second sub-bank SB2 designated by the programming address $A_{C2+1}$ based on the programming data D5 (in step #113). In addition, the comparing unit 17 of the device 1 of the present invention compares the value of the data DatC (data Q3) read in the last first cycle with the value of signal DatO (data D3), and outputs its result to the programming/erasing unit 19 as the result signal Comp (in step #111). The result signal Comp of "Pass3" showing that the value of the data Q3 coincides with that of the data D3 is outputted during time t16 to time t17 in FIG. 4.

The sub-bank control unit 21 of the device 1 of the present invention determines that the re-programming target cell $M_R$ does not exists in the first sub-bank SB1 in the next first cycle (during time t17 to time t18 in FIG. 4) as the action in the first sub-bank SB1 because the signal WE is not outputted from the programming/erasing unit 19 in the last second cycle. In addition, the sub-bank control unit 21 determines that the programming target cell $M_R$ does not exist in the first sub-bank SB1 (NO in step #112) because the address allocated to the sub-bank SB1 is not stored in the buffer 12. In addition, the comparing unit 17 of the device 1 of the present invention compares the value of the data DatC (data QC) read in the last second cycle with the value of the signal DatO (data D6), and outputs its result to the programming/erasing unit 19 as the result signal Comp (in step #111). The result signal Comp of "Err6" showing that the value of the data Q6 does not coincide with that of the data D6 is outputted during time t17 to time t18 in FIG. 4.

Concurrently, the sub-bank control unit 21 of the device 1 of the present invention performs the reading action for the programming verifying action in the programming target cell $M_R$ designated by the programming address $A_{C2+1}$ as the action in the second sub-bank SB2, and outputs the reading data Q5 as the data DatC (in step #122). In addition, since the result signal Comp outputted from the comparing unit 17 in the last second cycle is "Pass3", the programming/erasing unit 19 of the device 1 of the present invention determines that the programming action in the re-programming target cell $M_R$ designated by the address $A_{C1+3}$ has been normally completed during time t17 to time t18 in FIG. 4 and does not output the signal WE and the like to the sub-bank control unit 21.

The programming/erasing unit 19 of the device 1 of the present invention determines that the result of the programming verifying action is "Fail" because the result signal Comp outputted from the comparing unit 17 in the last first cycle is "Err6", and outputs the signal WE, the signal AddOw showing the address $A_{C2+2}$, the signal DatOw showing the data D6 to the sub-bank control unit 21 in the next second cycle (during time t18 to time t19 in FIG. 4), as the action in the first sub-bank SB1. In addition, the sub-bank control unit 21 determines whether or not the programming action in the first sub-bank SB1 has been completed. Since the programming action in the programming target cell $M_R$ designated by the address $A_{C2+2}$ has not been completed during time t18 to time t19 in FIG. 4, it is determined that the programming action in the first sub-bank SB1 has not been completed (NO in step #123).

Concurrently, the sub-bank control unit 21 of the device 1 of the present invention applies the programming voltage corresponding to the programming data D7 to the programming target cell $M_R$ designated by the programming address $A_{C2+3}$, as the action in the second sub-bank SB2 to perform the programming action (YES in step #112). In addition, the comparing unit 17 of the device 1 of the present invention compares the value of the data Date (data Q5) read in the last first cycle with that of the signal DatO (data D5), and outputs its result to the programming/erasing unit 19 as the result signal Comp (in step #111). The result signal Comp of "Pass5" showing that the value of the data Q5 coincides with that of the data D5 is outputted during time t18 to time t19 in FIG. 4.

The sub-bank control unit 21 of the device 1 of the present invention determines that the re-programming target cell $M_R$ exists (YES in step #112) because the signal WE is outputted from the programming/erasing unit 19 in the last second cycle, and applies the programming voltage for the re-programming action to the re-programming target cell $M_R$ designated by the programming address $A_{C2+2}$, based on the programming data D6 (in step #113) as the action in the first sub-bank SB1 in the next first cycle (corresponding to the first action cycle during time t19 to time t20 in FIG. 4).

Concurrently, the sub-bank control unit 21 of the device 1 of the present invention performs the reading action for the programming verifying action in the programming target cell $M_R$ designated by the programming address $A_{C2+3}$ as the action in the second sub-bank SB2, and outputs the reading data Q7 as the data Date (in step #122). In addition, since the result signal Comp outputted from the comparing unit 17 in the last second cycle is the "Pass5", the programming/erasing unit 19 of the device 1 of the present invention determines that the programming action in the programming target cell $M_R$ designated by the programming address $A_{C2+3}$ has been normally completed during time t19 to time t20 in FIG. 4, and does not output the signal WE and the like to the sub-bank control unit 21.

The sub-bank control unit 21 of the device 1 of the present invention performs the reading action for the programming verifying action for the re-programming action in the re-programming target cell $M_R$ designated by the programming address $A_{C2+2}$ as the action in the first sub-bank SB1 in the next second cycle (during time t20 to time t21 in FIG. 4), and outputs the reading data Q6 as the data DatC (in step #122). In addition, since the result signal Comp is not outputted from the comparing unit 17 in the last first cycle, the programming/erasing unit 19 of the device 1 of the present invention does not output the signal WE and the like to the sub-bank control unit 21 during time t20 to time t21 in FIG. 4.

Concurrently, the sub-bank control unit 21 of the device 1 of the present invention determines that the re-programming target cell $M_R$ does not exist in the second sub-bank SB2 since the signal WE is not outputted from the programming/erasing unit 19 in the last first cycle, as the action in the second sub-bank SB2. In addition, since the programming address is not stored in the buffer 12, the sub-bank control unit 21 determines that the programming target cell $M_R$ does not exist in the second sub-bank SB2 (NO in step #112). In addition, the comparing unit 17 of the device 1 of the present invention compares the value of the data DatC (data Q7) read in the last first cycle with the value of the signal DatO (data D7), and outputs its result to the programming/erasing unit 19 as the result signal Comp (in step #111). The result signal Comp of "Pass7" showing that the value of the data Q7 coincides with that of the data D7 is outputted during time t20 to time t21 in FIG. 4.

The comparing unit 17 of the device 1 of the present invention compares the value of the data DatC (data Q6) read in the last second cycle with the value of the signal DatO (data D6), in the next cycle (during time t21 to time t22 in FIG. 4) as the action in the first sub-bank SB1, and outputs its result to the programming/erasing unit 19 as the result signal Comp (in step #111). The result signal Comp of "Pass6" showing that the value of the data Q6 coincides with that of the data D6 is outputted during time t21 to time t22 in FIG. 4.

Concurrently, the sub-bank control unit 21 of the device 1 of the present invention determines whether or not the programming action in the second sub-bank SB2 has been completed as the action in the second SB2 because the re-programming target cell $M_R$ and the programming target cell $M_R$ do not exist in the second sub-bank SB2 in the last second cycle. Since the result signal Comp outputted from the comparing unit 17 in the last second cycle is "Pass7", the control unit 21 determines that the programming action in the re-programming target cell $M_R$ designated by the programming address $A_{C2+3}$ has been normally completed during time t21 to time t22 in FIG. 4 and determines that the programming action in all the programming target cells $M_R$ in the second sub-bank SB2 have been completed (YES in step #123), and completes the programming action in the second sub-bank SB2.

Then, the programming/erasing unit 19 of the device 1 of the present invention determines that the programming action in the programming target cell $M_R$ designated by the programming address $A_{C2+2}$ has been normally completed as the action in the first sub-bank SB1 because the result signal Comp outputted from the comparing unit 17 for time t21 to time t22 is "Pass6", and does not output the signal WE and the like to the sub-bank control unit 21. Then, the sub-bank control unit 21 of the present invention determines that the re-programming target cell $M_R$ does not exist in the first sub-bank SB1 because the signal WE is not outputted and determines that the programming target cell $M_R$ does not exist in the first sub-bank SB1 because the programming address is not stored in the buffer 12 (NO in step #112). Furthermore, the sub-bank control unit 21 determines that the programming action in all of the programming target cells $M_R$ in the first sub-bank SB1 has been completed during time t21 to time t22 in FIG. 4 (YES in step #123), and completes the programming action in the first sub-bank SB1. Thus, the programming actions in the first sub-bank SB1 and the second sub-bank SB2 in the memory cell array are completed.

As can be clear from FIG. 4, according to this embodiment, since the programming action and programming verifying action in the second sub-bank SB2 are completed during a period of programming action and programming verifying action in the first sub-bank SB1, a time taken for the programming action and programming verifying action can be shortened as a whole because of a reduction in time for the programming action and the programming verifying action in the second sub-bank SB2, in the memory cell array, as compared with the case where the programming action and the programming verifying action in the first sub-bank SB1 and those in the second sub-bank SB2 are sequentially performed.

Second Embodiment

A second embodiment of a device 1 of the present invention will be described with reference to FIGS. 5 and 6. In this embodiment, a description will be made of a configuration different from that of the sub-bank of the memory cell array in the first embodiment.

Figure 5:
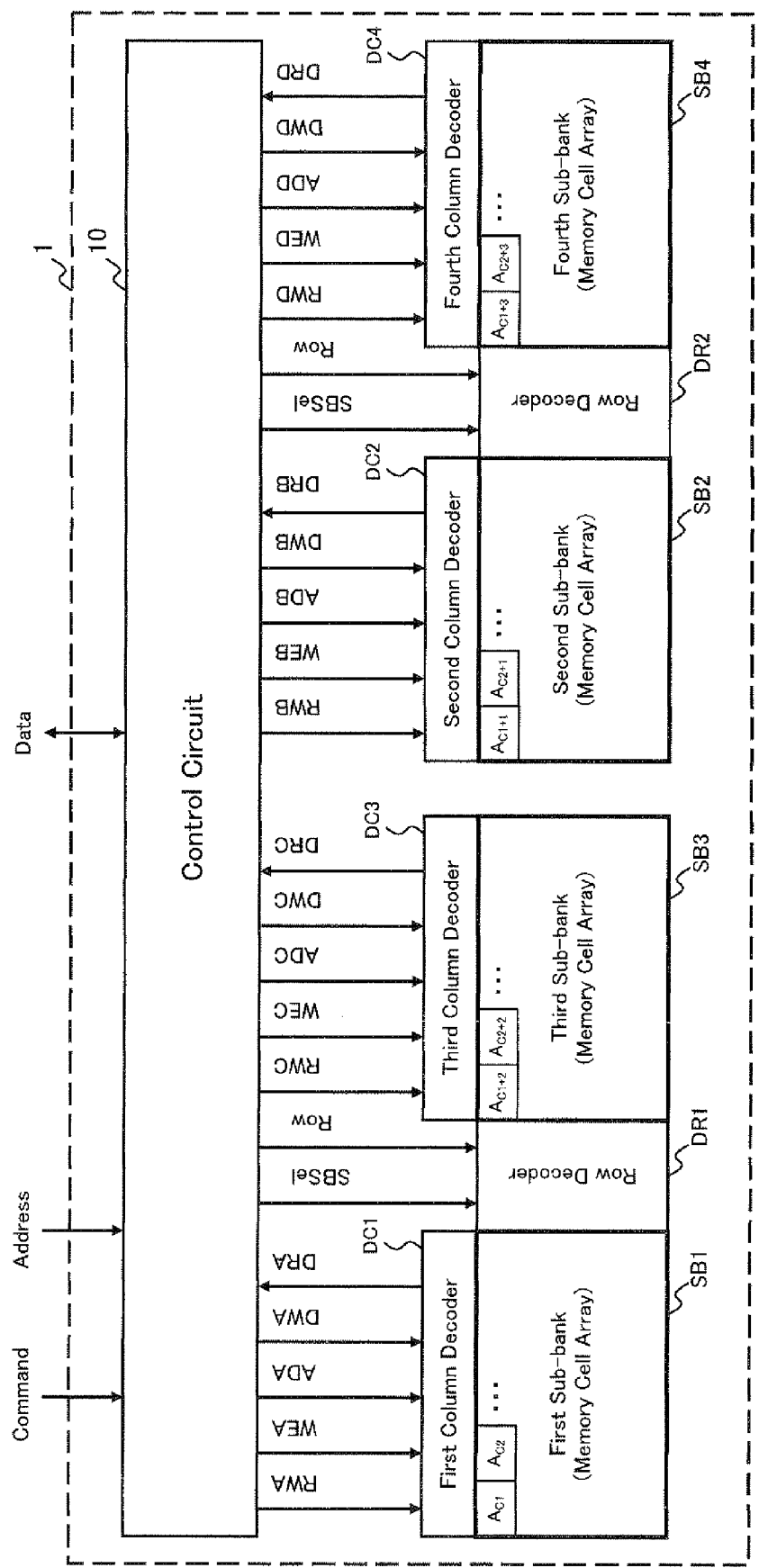
FIG. 5 is a schematic part block diagram showing a schematic configuration example in a second embodiment of a nonvolatile semiconductor memory device according to the present invention.

Here, FIG. 5 shows a schematic configuration example of the device 1 of the present invention. As shown in FIG. 5, the device 1 of the present invention includes a memory cell array composed of four sub-banks such as a first sub-bank SB1 to a fourth sub-bank SB4, a first row decoder DR1 which applies a voltage to the word lines of the first sub-bank SB1 and the third sub-bank SB3, a second row decoder DR2 which applies a voltage to the word lines of the second sub-bank SB2 and the fourth sub-bank SB4, a first column decoder DC1 which applies a voltage to the bit line of the first sub-bank SB1 based on the instruction from a control circuit 10 which will be described below, a second column decoder DC2 which applies a voltage to the bit line of the second sub-bank SB2 based on the instruction from the control circuit 10 which will be described below, a third column decoder DC3 which applies a voltage to the bit line of the third sub-bank SB3 based on the instruction from the control circuit 10 which will be described below, a fourth column decoder DC4 which applies a voltage to the bit line of the fourth sub-bank SB4 based on the instruction from the control circuit 10 which will be described below, and the control circuit 10 which controls actions including a programming action and programming verifying action. In addition, similar to the first embodiment, the device 1 of the present invention has a burst function that executes a plurality of programming commands continuously.

The configurations of the first sub-bank SB1, the second sub-bank SB2, the first column decoder DC1, and the second column decoder DC2 are the same as those in the first embodiment. In addition, the configurations of the third sub-bank SB3 and the fourth sub-bank SB4 are the same as those of the first sub-bank SB1 and the second sub-bank SB2 in the first embodiment. According to this embodiment, the first sub-bank SB1 and the third sub-bank SB3 serve as a pair of sub-banks, and share the first row decoder DR1. In addition, the second sub-bank SB2 and the fourth sub-bank SB4 serve as a pair of sub-banks, and share the second row decoder DR2.

According to this embodiment, as shown in FIG. 5, addresses of multiples of four ($A_{C1}, A_{C2}, \ldots$) are allocated to the first sub-bank SB1, addresses of multiples of four+1 ($A_{C1+1}, A_{C2+1}, \ldots$) are allocated to the second sub-bank SB2, addresses of multiples of four+2 ($A_{C1+2}, A_{C2+2}$, are allocated to the third sub-bank SB3, and addresses of multiples of four+3 ($A_{C1+3}, A_{C2+3}$, are allocated to the fourth sub-bank SB4.

The control circuit 10 includes a command control unit 11 receiving an externally inputted command and controlling each circuit unit, a buffer 12 storing an externally inputted address signal, an output control unit 13 controlling output data outputted from the first sub-bank SB1 or the second sub-bank SB2, a buffer 14 storing the output data and externally inputted data, a row address buffer 15 storing a row address in the address signal stored in the buffer 12, a reading unit 16 controlling a reading action, a comparing unit 17 comparing the output data with programming data, a buffer 18 storing an address signal AddCr from the reading unit 16, a programming/erasing unit 19 controlling the programming action, the programming verifying action, and the erasing action, an action switching control unit 20, and a sub-bank control unit 21 although they are not shown.

A description will be made of a processing action of the device 1 of the present invention in this embodiment with reference to FIG. 6. Here, FIG. 6 shows a timing chart of the programming action and the programming verifying action in this embodiment.

Figure 6A:
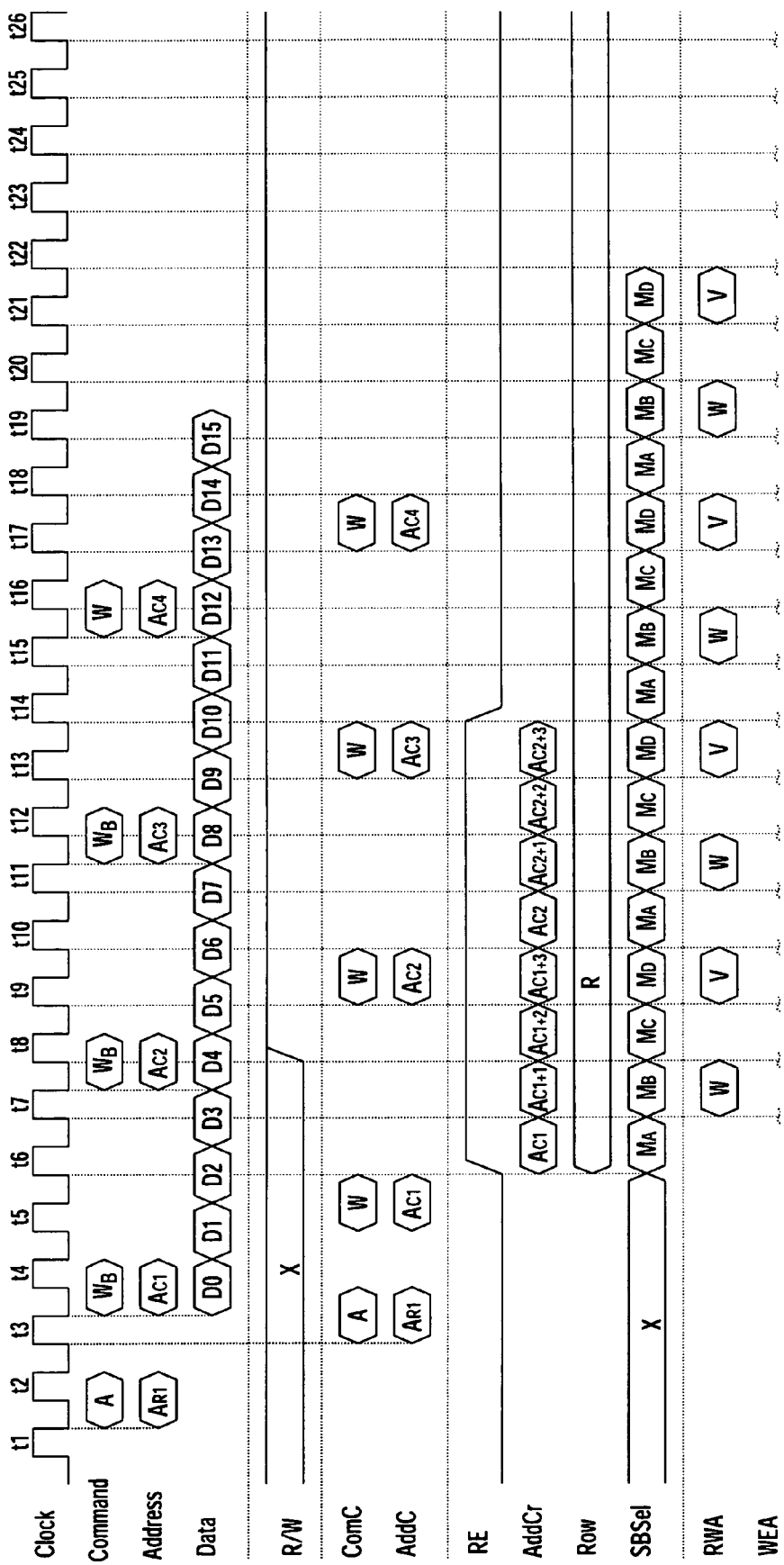
FIG. 6 is a timing chart showing a programming action and a programming verifying action in the second embodiment of the nonvolatile semiconductor memory device according to the present invention.
Figure 6B:
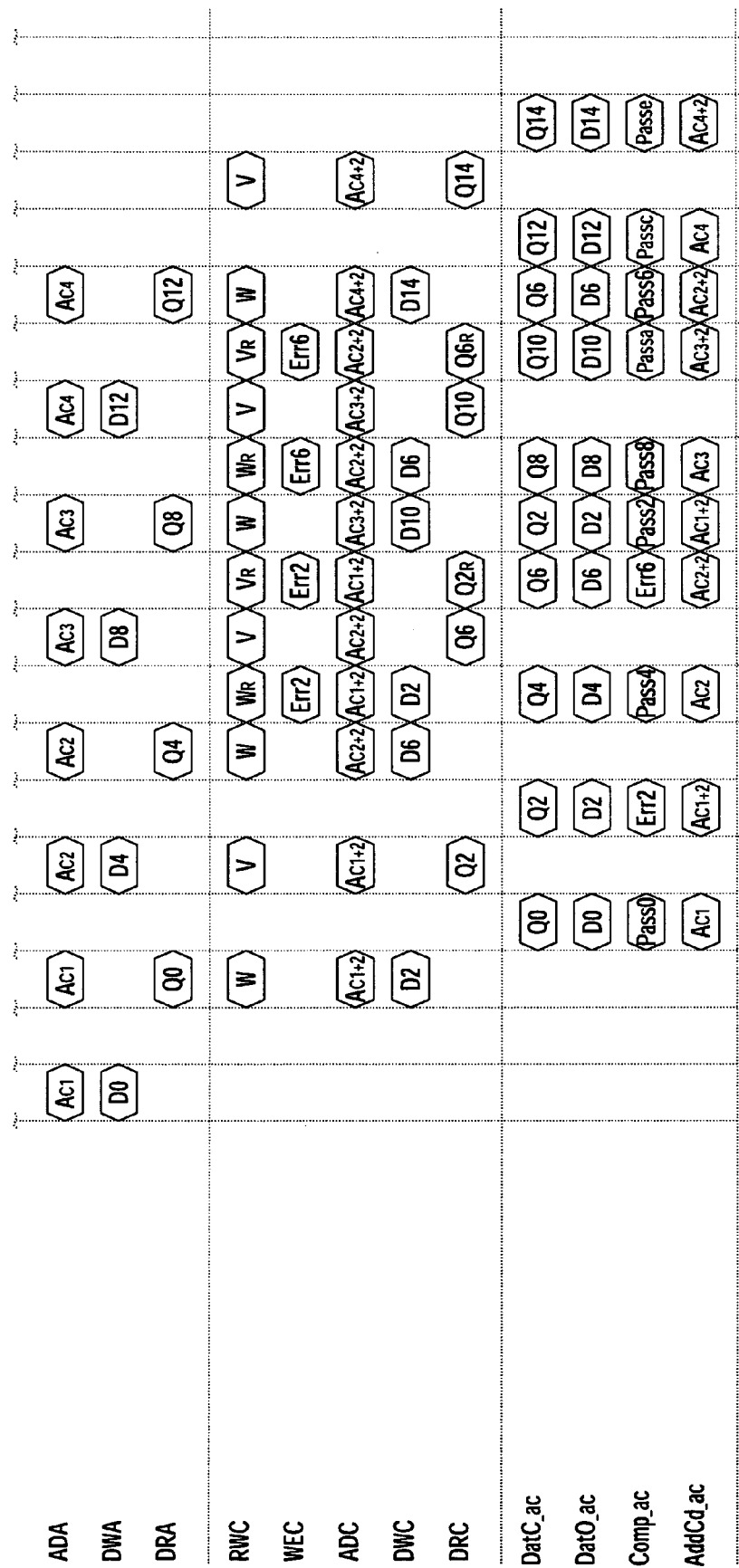
Figure 6C:
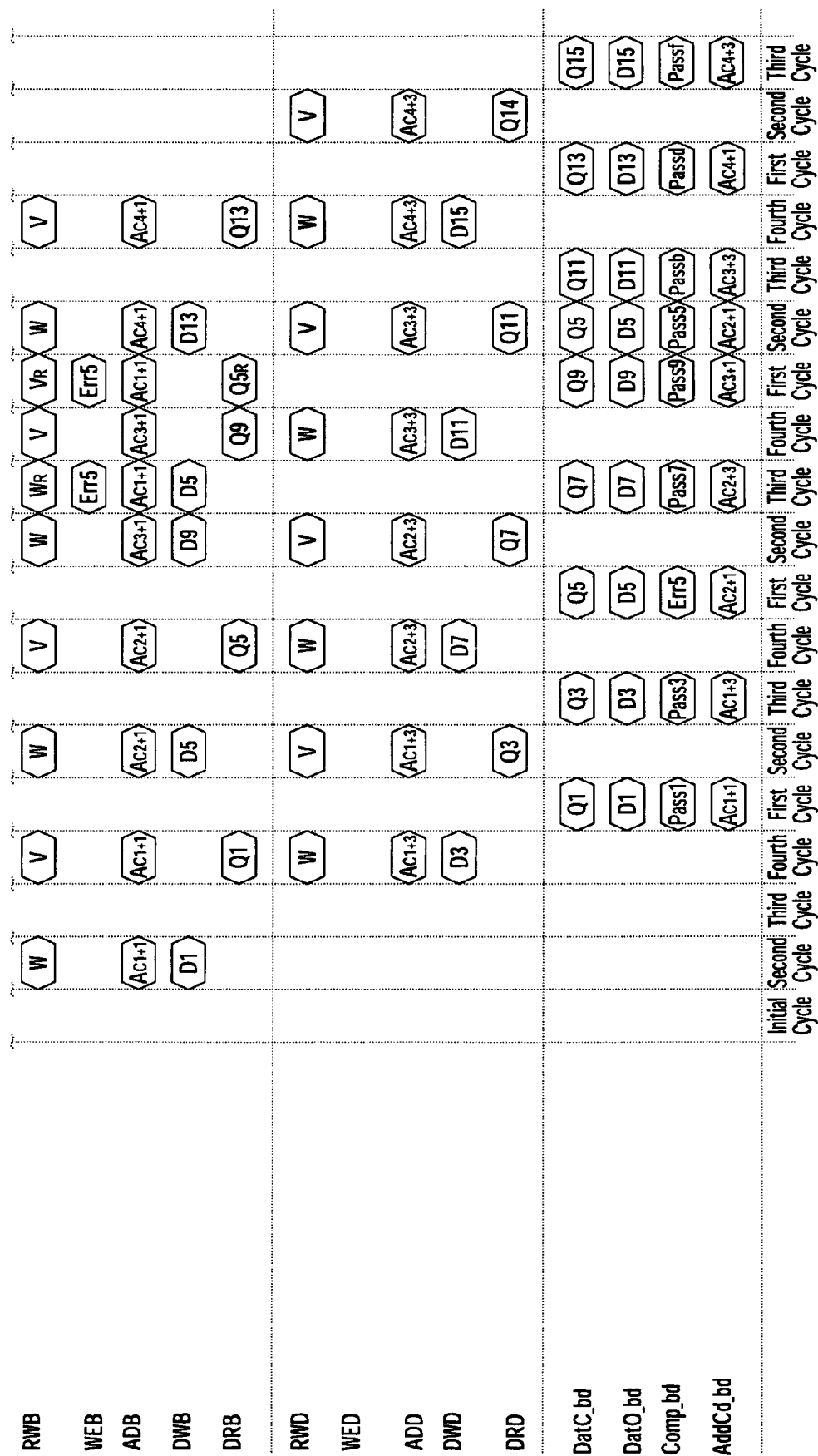

According to this embodiment, as shown in FIG. 6, four cycles are repeated sequentially. In the first cycle, the programming action in the first sub-bank SB1 and the reading action for the programming verifying action in the third sub-bank SB3 are performed. In the second cycle, the programming action in the second sub-bank SB2 and the reading action for the programming verifying action in the fourth sub-bank SB4 are performed. In the third cycle, the reading action for the programming verifying action in the first sub-bank SB1 and the programming action in the third sub-bank SB3 are performed. In the fourth cycle, the reading action for the programming verifying action in the second sub-bank SB2 and the programming action in the fourth sub-bank SB4 are performed.

Thus, a re-programming action in the first sub-bank SB1 is performed in the second cycle, and the reading action for the programming verifying action for the re-programming action is performed in the fourth cycle. Similarly, the re-programming action in the third sub-bank SB3 is performed in the fourth cycle, and the reading action for the programming verifying action for the re-programming action is performed in the second cycle. The re-programming action in the second sub-bank SB2 is performed in the third cycle, and the reading action for the programming verifying action for the re-programming action is performed in the first cycle. The re-programming action in the fourth sub-bank SB4 is performed in the first cycle, and the reading action for the programming verifying action for the re-programming action is performed in the third cycle.

As described above, as shown in FIG. 6, since the re-programming action, and the reading action for the programming verifying action for the re-programming action are performed in the middle cycle between the cycles for performing the programming action and the reading action for the programming verifying action, a time taken for the programming action and the programming verifying action can be reduced as a whole in the memory cell array.

Another Embodiment (1) Although the memory cell array has the two sub-banks in the first embodiment, and the memory cell array has the four sub-banks in the second embodiment, the present invention is not limited to those. The memory cell array may have more sub-banks as long as the number of the sub-banks is even number. In this case, the common row decoder is provided for each sub-bank pair, and the column decoder is provided for each sub-bank.

(2) Although the memory cells $M_R$ in the first sub-bank SB1 and the second sub-bank SB2 are all in the erased state and then the program state is made in the above first and second embodiments for the purpose of easier understanding, the present invention is not limited to the above.

For example, like the RRAM in which the load resistance characteristics of a load circuit are switched at the programming action and the erasing action as disclose in U.S. Pat. No. 7,433,222, the RRAM capable of performing the programming action and erasing action at the same time may be configured such that in a first cycle, at least one of the programming action in the programming target cell $M_R$, and the erasing action in the erasing target cell $M_R$ in the first sub-bank is executed, and at least one of the reading action in the programming verifying action in the programming target cell $M_R$, and the reading action for the erasing verifying action in the erasing target cell $M_R$ in the second sub-bank is executed, and in a second cycle, at least one of the reading action for the programming verifying action in the programming target cell $M_R$ and the reading action for the erasing verifying action in the erasing target cell $M_R$ in the first sub-bank is executed, and at least one of the reading action for the programming verifying action in the programming target cell $M_R$, and the reading action for the erasing verifying action in the erasing target cell $M_R$ in the second sub-bank is executed.

(3) Although the descriptions have been made of the case where the programming time for the programming action and the reading time for the reading action are roughly the same, and the other programming verifying action after the reading action is executed in the cycle next to the reading action, the present invention is not limited to the above. When the reading time is considerably shorter than the programming time, the action after the reading action for the programming verifying action in the other sub-bank may be executed in advance in the same cycle as the programming action in the one sub-bank.

(4) Although the device 1 of the present invention is the RRAM, and the memory cell $M_R$ has the 1T1R structure composed of one transistor and one variable resistive element in the first and second embodiments, the present invention is not limited to the above. The memory cell $M_R$ may be a memory cell $M_R$ in a cross-point type memory cell array, or a memory cell having a 1D1R structure in which a variable resistive element and a diode are connected in series.

(5) Although it is assumed that the device 1 of the present invention is the RRAM in the first and second embodiments, the present invention is not limited to the above. In addition, the device 1 of the present invention is suitable for a nonvolatile semiconductor memory device in which a programming time and a reading time are completed in roughly the same period (in the same cycle).

Figure 7:
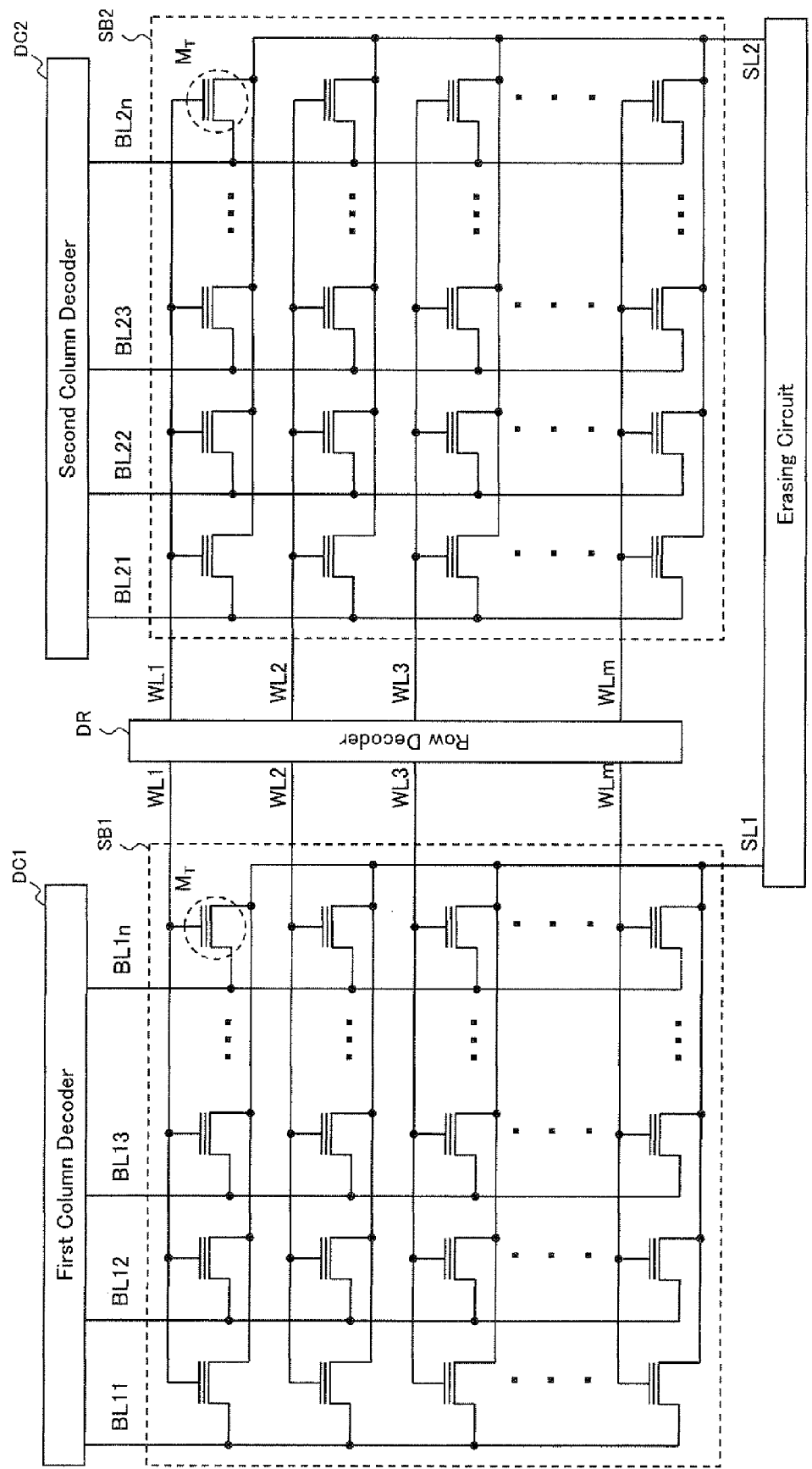
FIG. 7 is a schematic part block diagram showing a schematic configuration example of a memory cell array in another embodiment of a nonvolatile semiconductor memory device according to the present invention.
Figure 8:
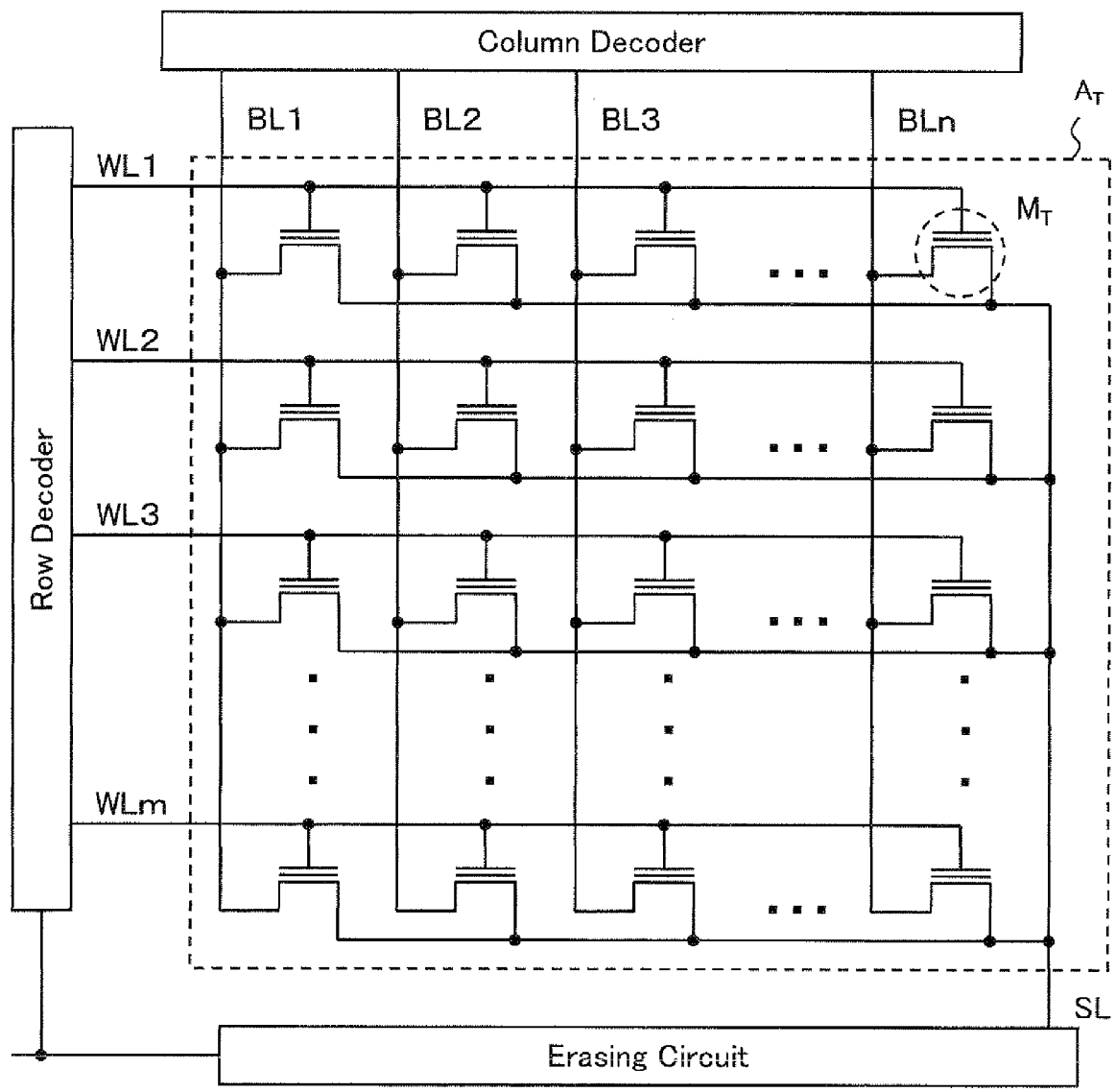
FIG. 8 is a schematic part circuit diagram showing a schematic configuration example of a memory cell array of an ETOX flash memory.
Figure 9:
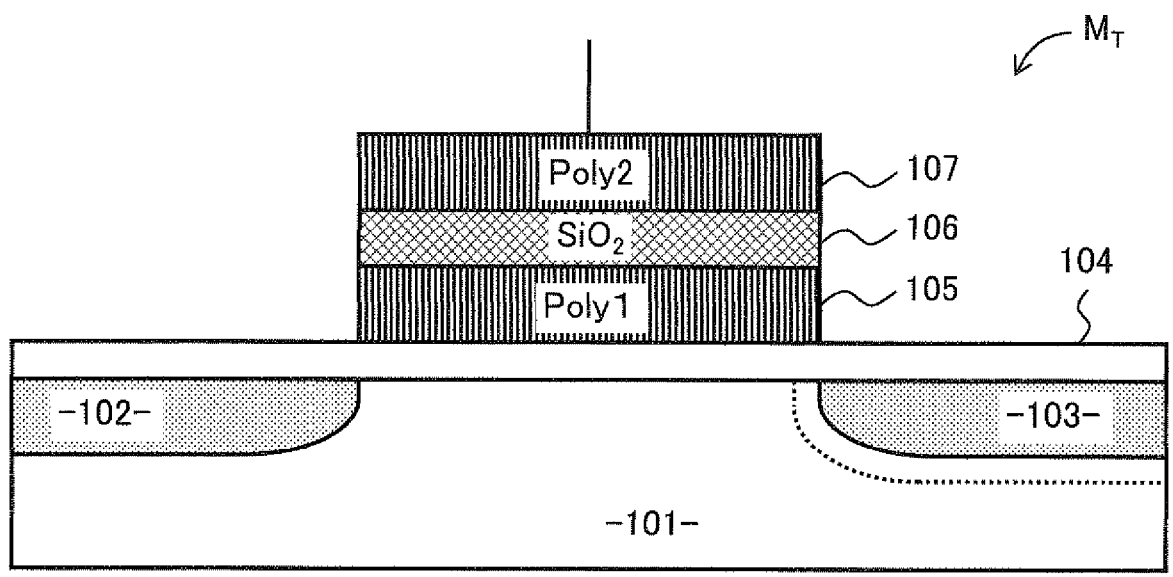
FIG. 9 is a schematic part block diagram showing a schematic configuration example of an ETOX cell in the ETOX flash memory.
Figure 10:
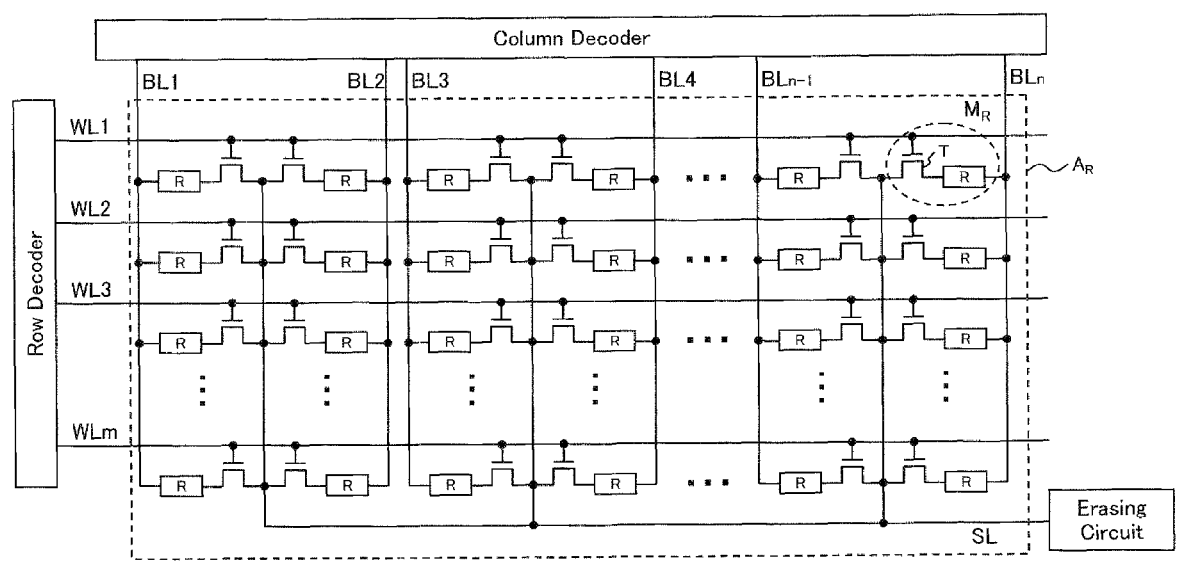
FIG. 10 is a schematic part circuit diagram showing a schematic configuration example of a memory cell array of a RRAM.
Figure 11:
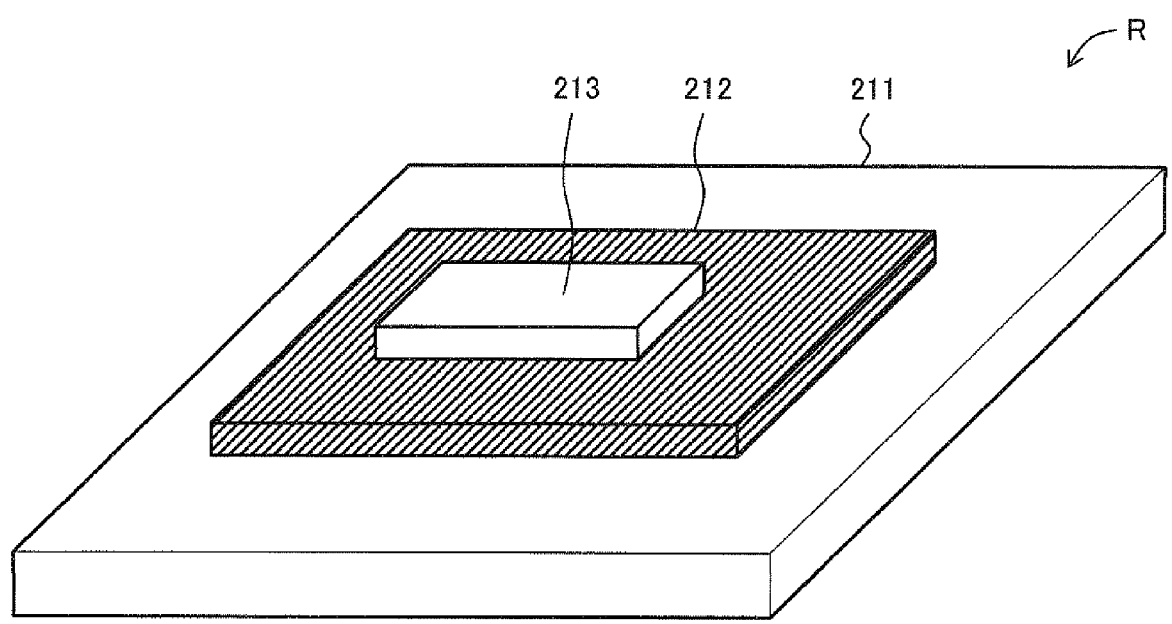
FIG. 11 is a schematic part block diagram showing a schematic configuration example of a variable resistive element in a memory cell of the RRAM.
Figure 12:
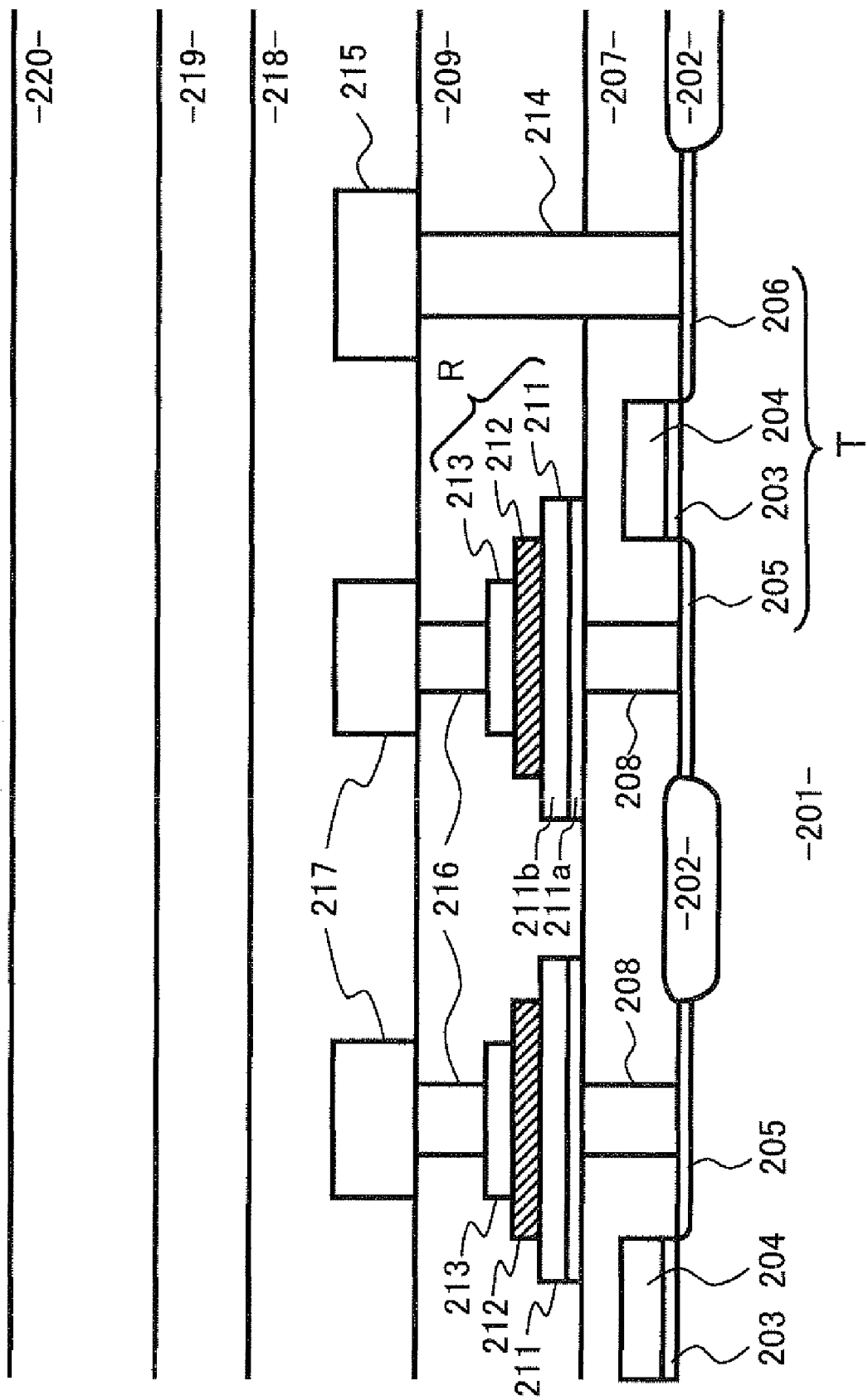
FIG. 12 is a schematic part sectional view showing a schematic configuration example of the memory cell of the RRAM.

The device 1 of the present invention may be applied to a nonvolatile semiconductor memory device such as a MRAM (Magnetoresistive Random Access Memory), and OUM (Ovonics Unified Memory). In addition, it can be applied to another nonvolatile memory such as a clock synchronization type of ETOX flash memory shown in FIG. 7.

Figure 13:
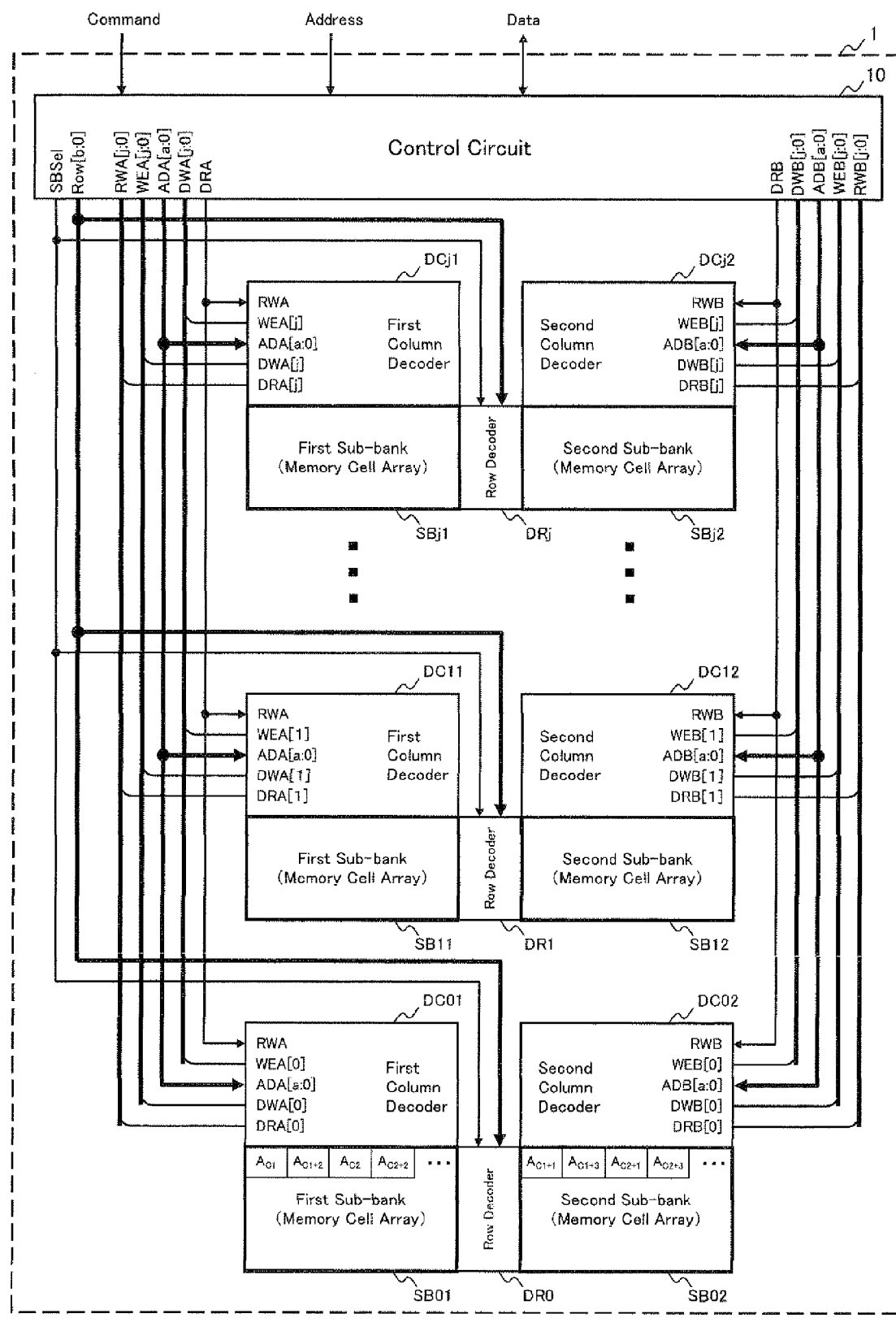
FIG. 13 is a schematic part block diagram showing a schematic configuration example in another embodiment of a nonvolatile semiconductor memory device according to the present invention.

(6) Although one programming data is composed of one bit for easier understanding in the first and second embodiments, the present invention is not limited to the above. When data is composed of the plurality of bits, the pair of sub-banks may be provided for each corresponding bit, that is, the pairs of sub-banks having the same number as the data length of the programming data may be provided as shown in FIG. 13. In addition, in FIG. 13, "j" is equal to the number provided by subtracting one from the data length.

In addition, the address corresponding to each bit of the programming data may be set by adding "ordinal number of the bits−1" to a head address in order to correspond to the programming data having the plurality of bits. In this case, when the burst function is provided, the head address of the column address of each programming data generated automatically is set by adding "data length of the programming data×(ordinal number of the programming data−1)" to the column address designated by the programming command.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile semiconductor memory device comprising:
   a memory cell array having a first sub-bank having a plurality of nonvolatile memory cells arranged in a form of a matrix in which first terminals of the memory cells on a same row are connected to a common word line, and second terminals of the memory cells on a same column are connected to a common bit line, and a second sub-bank having a same configuration as that of the first sub-bank;
   a row decoder shared by the first sub-bank and the second sub-bank and arranged to apply a voltage to corresponding word lines in the first sub-bank and the second sub-bank at a same time;
   a first column decoder arranged to apply a voltage to the bit line of the first sub-bank;
   a second column decoder arranged to apply a voltage to the bit line of the second sub-bank; and
   a control circuit arranged to control a programming action, a programming verifying action, a re-programming action for the memory cell determined such that the programming action has not been normally performed in the programming verifying action, the programming verifying action for the re-programming action, an erasing action, an erasing verifying action, a re-erasing action for the memory cell determined such that the erasing action has not been normally performed in the erasing verifying action, and the erasing verifying action for the re-erasing action, in the memory cell array, wherein
   the control circuit performs the programming action to the first sub-bank and a reading action for the programming verifying action to the second sub-bank in a first action cycle and performs the reading action for the programming verifying action to the first sub-bank and the programming action to the second sub-bank in a second action cycle, and
   the control circuit executes the first action cycle and the second action cycle alternately.

2. The nonvolatile semiconductor memory device according to claim 1, wherein
   the control circuit performs:
   the re-programming action to the first sub-bank, and a reading action for the programming verifying action for the re-programming action to the second sub-bank in the first action cycle; and
   the reading action for the programming verifying action for the re-programming action to the first sub-bank, and the re-programming action to the second sub-bank in the second action cycle.

3. The nonvolatile semiconductor memory device according to claim 1, wherein
   the control circuit performs;
   the erasing action to the first sub-bank, and a reading action for the erasing verifying action to the second sub-bank in the first action cycle; and
   the reading action for the erasing verifying action to the first sub-bank, and the erasing action to the second sub-bank in the second action cycle.

4. The nonvolatile semiconductor memory device according to claim 3, wherein
   the control circuit performs:
   the re-erasing action to the first sub-bank, and a reading action for the erasing verifying action for the re-erasing action to the second sub-bank in the first action cycle; and
   the reading action for the erasing verifying action for the re-erasing action to the first sub-bank, and the re-erasing action to the second sub-bank in the second action cycle.

5. The nonvolatile semiconductor memory device according to claim 1, wherein
   the memory cell array includes a plurality of pairs of sub-banks each composed of the first sub-bank and the second sub-bank,
   the first column decoder and the second column decoder are provided for each pair of sub-banks, and
   the control circuit performs, in a middle cycle between the first action cycle and the second action cycle in a predetermined pair of sub-banks, at least one of the first action cycle to one sub-bank and the second action cycle to the other sub-bank in a pair of sub-banks other than the predetermined pair of sub-banks, and at a same time performs at least one of the re-programming action to one sub-bank and the reading action for the programming verifying action for the re-programming action to the other sub-bank in the predetermined pair of sub-banks in the middle cycle.

6. The nonvolatile semiconductor memory device according to claim 5, wherein
the control circuit performs:
the erasing action to the first sub-bank, and a reading action for the erasing verifying action to the second sub-bank in the first action cycle; and
the reading action for the erasing verifying action to the first sub-bank, and the erasing action to the second sub-bank in the second action cycle.

7. The nonvolatile semiconductor memory device according to claim 6, wherein
the control circuit performs, in a middle cycle between the first action cycle and the second action cycle in a predetermined pair of sub-banks, at least one of the first action cycle to one sub-bank and the second action cycle to the other sub-bank in a pair of sub-banks other than the predetermined pair of sub-banks, and at a same time performs at least one of the re-erasing action to one sub-bank and the reading action for the erasing verifying action for the re-erasing action to the other sub-bank in the predetermined pair of sub-banks in the middle cycle.

8. The nonvolatile semiconductor memory device according to claim 1, wherein
the control circuit has a burst function for continuously performing the programming action and the programming verifying action for a memory cell group composed of a predetermined number of memory cells based on a burst length, in response to one programming command, and
the control circuit automatically allocates addresses from a head address to following addresses in the memory cell group designated by the programming command to the first sub-bank and the second sub-bank, in the programming action by the burst function.

9. The nonvolatile semiconductor memory device according to claim 1, wherein
the control circuit has a burst function for continuously performing the erasing action and the erasing verifying action for a memory cell group composed of a predetermined number of memory cells based on a burst length, in response to one erasing command, and
the control circuit automatically allocates addresses from a head address to following addresses in the memory cell group designated by the erasing command to the first sub-bank and the second sub-bank, in the erasing action by the burst function.

10. A controlling method of a nonvolatile semiconductor memory device, the nonvolatile semiconductor memory device comprising:
a memory cell array having a first sub-bank having a plurality of nonvolatile memory cells arranged in a form of a matrix in which first terminals of the memory cells on a same row are connected to a common word line, and second terminals of the memory cells on a same column are connected to a common bit line, and a second sub-bank having a same configuration as that of the first sub-bank;
a row decoder shared by the first sub-bank and the second sub-bank and arranged to apply a voltage to corresponding word lines in the first sub-bank and the second sub-bank at a same time;
a first column decoder arranged to apply a voltage to the bit line of the first sub-bank;
a second column decoder arranged to apply a voltage to the bit line of the second sub-bank; and
a control circuit arranged to control a programming action, a programming verifying action, a re-programming action for the memory cell determined such that the programming action has not been normally performed in the programming verifying action, the programming verifying action for the re-programming action, an erasing action, an erasing verifying action, a re-erasing action for the memory cell determined such that the erasing action has not been normally performed in the erasing verifying action, and the erasing verifying action for the re-erasing action, in the memory cell array, the controlling method including:
a first action step to perform the programming action to the first sub-bank and a reading action for the programming verifying action to the second sub-bank; and
a second action step to perform the reading action for the programming verifying action to the first sub-bank and the programming action to the second sub-bank in a second action step, wherein
the first action step and the second action step are alternately executed.

11. The controlling method according to claim 10, wherein
when the nonvolatile semiconductor memory device comprises the memory cell array including a plurality of pairs of sub-banks each composed of the first sub-bank and the second sub-bank, and the first column decoder and the second column decoder are provided for each pair of sub-banks,
in a middle step between the first action step and the second action step in a predetermined pair of sub-banks, at least one of the first action step to one sub-bank and the second action step to the other sub-bank in a pair of sub-banks other than the predetermined pair of sub-banks is performed in parallel with at least one of the re-programming action to one sub-bank and the reading action for the programming verifying action for the re-programming action to the other sub-bank in the predetermined pair of sub-banks.

* * * * *